US012787629B2

(12) United States Patent
Escrig et al.

(10) Patent No.: US 12,787,629 B2
(45) Date of Patent: Nov. 3, 2026

(54) PROCESS FOR MAKING MULTICOMPONENT PEROVSKITES

(71) Applicant: OXFORD PHOTOVOLTAICS LIMITED, Yarnton (GB)

(72) Inventors: Lidón Gil Escrig, Atzeneta del Maestrat (ES); Isidora Susic, Valencia (ES); Francisco Palazon, Bétera (ES); Michele Sessolo, Valencia (ES); Hendrik Jan Bolink, Moncada (ES); Nicola Beaumont, Yarnton (GB); Laura Miranda Perez, Yarnton (GB); Christopher Case, Yarnton (GB)

(73) Assignee: Oxford Photovoltaics Limited, Yarnton (GB)

( * ) Notice: Subject to any disclaimer, the term of this patent is extended or adjusted under 35 U.S.C. 154(b) by 19 days.

(21) Appl. No.: 18/845,680

(22) PCT Filed: Mar. 10, 2023

(86) PCT No.: PCT/EP2023/056247
§ 371 (c)(1),
(2) Date: Sep. 10, 2024

(87) PCT Pub. No.: WO2023/170304
PCT Pub. Date: Sep. 14, 2023

(65) Prior Publication Data

US 2025/0212674 A1 Jun. 26, 2025

(30) Foreign Application Priority Data

Mar. 11, 2022 (EP) .................................... 22382235

(51) Int. Cl.
*H10K 71/16* (2023.01)
*C23C 16/40* (2006.01)
(Continued)

(52) U.S. Cl.
CPC ......... *H10K 71/164* (2023.02); *C23C 16/409* (2013.01); *C23C 16/448* (2013.01); *H10K 30/10* (2023.02); *H10K 30/57* (2023.02)

(58) Field of Classification Search
None
See application file for complete search history.

(56) References Cited

U.S. PATENT DOCUMENTS

2017/0226641 A1* 8/2017 Qi ......................... C23C 14/243
2020/0148711 A1* 5/2020 Leijtens ................ H10K 30/15
(Continued)

FOREIGN PATENT DOCUMENTS

JP 2021174940 A 11/2021
JP 2022511773 A 2/2022
(Continued)

OTHER PUBLICATIONS

International Search Report and Written Opinion received in PCT/EP2023/056247 mailed Jun. 22, 2023.
(Continued)

*Primary Examiner* — Daniel P Malley, Jr.
(74) *Attorney, Agent, or Firm* — Meunier Carlin & Curfman LLC

(57) ABSTRACT

The invention provides a method of forming a perovskite material from a plurality of evaporation sources comprising co-subliming from: (i) a first evaporation source comprising a mixture of co-sublimable organic halides, wherein the organic halides comprise: a. a first organic halide comprising an organic cation A; b. a second organic halide comprising an organic cation A' which is different to A and has a larger ionic radius than the first organic cation A; and (ii) a second evaporation source comprising one or more metal halides having the formula (I): $B(X_yX'_{1-y})2$ (I) wherein B is a divalent metal cation, X and X' are different halides and
(Continued)

$0 \leq y < 1$; and (iii) one or more further organic halides from one or more further evaporation sources; and/or (iv) one or more inorganic halides from one or more further evaporation sources; to form the perovskite material, wherein the perovskite material comprises three or more different cations in the A site. Perovskite materials and semiconductor devices, typically photovoltaic devices, are also provided.

26 Claims, 4 Drawing Sheets

(51) Int. Cl.

| | |
|---|---|
| ***C23C 16/448*** | (2006.01) |
| ***H10K 30/10*** | (2023.01) |
| ***H10K 30/57*** | (2023.01) |

(56) References Cited

U.S. PATENT DOCUMENTS

2020/0239499 A1* 7/2020 Zhu ...................... C01G 19/006
2024/0117524 A1* 4/2024 Alberti .................. C30B 25/165

FOREIGN PATENT DOCUMENTS

| | | | |
|---|---|---|---|
| WO | 2013/171517 | A1 | 11/2013 |
| WO | 2014/045021 | A1 | 3/2014 |
| WO | 2016/005758 | A1 | 1/2016 |
| WO | 2016/198889 | A1 | 12/2016 |
| WO | 2017/089819 | A1 | 6/2017 |
| WO | 2018015831 | A1 | 1/2018 |
| WO | 2020147939 | A1 | 7/2020 |
| WO | 2021108754 | A1 | 6/2021 |

OTHER PUBLICATIONS

Kam et al., “Efficient Mixed-Cation Mixed-Halide Perovskite Solar Cells by All-Vacuum Sequential Deposition Using Metal Oxide Electron Transport Layer”, Solar RRL, vol. 3, 2019, p. 7, XP002807206, p. 5, left-hand col.

Otalora Camilo et al., “Hybrid perovskite films deposited by thermal evaporation from a single source”,Journal of Materials Science: Materials in Electronics, Chapman and Hall, London, GB, vol. 32, No. 9, Apr. 7, 2021 (Apr. 7, 2021), pp. 12151-12163, XP037454001, ISSN: 0957-4522, DOI: 10.1007/S10854-021-05844-3 [retrieved on Apr. 7, 2021] paragraph [0002].

Yerramilli Aditya S. et al., “Phenyl Ethylammonium lodide introduction into inverted triple cation perovskite solar cells for improved voe and stability”, Organic Electronics, vol. 93, Jun. 1, 2021 (Jun. 1, 2021), p. 106121, XP055947330, Amsterdam, NL ISSN: 1566-1199, DOI: 10.1016/j.orgel.2021.106121 paragraph [0003] p. 2, left-hand col. paragraph [02.1]—paragraph [02.2].

Zhang Weihai et al., “Guanidinium induced phase separated perovskite layer for efficient and highly stable solar cells”, Journal of Materials Chemistry A, vol. 7, No. 16, Apr. 16, 2019 (Apr. 16, 2019), pp. 9486-9496, XP055947378, GB ISSN: 2050-7488, DOI: 10.1039/C9TA01893J p. 9494, left-hand col.

Ball et al., “Dual-Source Coevaporation of Low-Bandgap FA,, Cs Sn—Pb 13 Perovskites for Photovoltaics”, ACS Energy Lett, vol. 4, No. 11, 2019, pp. 2748-2756, XP002807207, p. 2749, left-hand col.

Gil-Escrig Lidon et al., “Vacuum Deposited Triple-Cation Mixed-Halide Perovskite Solar Cells”, Advanced Energy Materials, vol. 8, No. 14, May 1, 2018 (May 1, 2018), p. 1703506, XP055947472, DE ISSN: 1614-6832, DOI: 10.1002/aenm.201703506 p. 1703506; table 1.

Rajagopal et al., “Highly Efficient Perovskite-Perovskite Tandem Solar Cells Reaching 80% of the Theoretical Limit in Photovoltage”, Advanced Materials, VCH Publishers, DE, vol. 29, No. 34, Jul. 10, 2017 (Jul. 10, 2017) , p. n/a, XP071871626, ISSN: 0935-9648, DOI: 10.1002/ADMA.201702140 abstract.

Muñoz et al, “Room temperature vacuum-deposition of CsPbI2Br perovskite films from multiple-sources and mixed halide precursors”, Chem. Mater., 32, 8641, 2020.

Jodlowski et al., “Large guanidinium cation mixed with methylammonium in lead iodide perovskites for 19% efficient solar cells”, Nature Energy, 2, 927-9279, 2017.

La-Placa et al, “Vacuum-deposited 2D/3D perovskite heterojunctions”, ACS Energy Lett. 2019, 4, 12, 2893-2901.

Unlu et al, “Understanding the interplay of stability and efficiency in A-site engineered lead halide perovskites”, APL Materials 8, 070901, 2020.

“Photovoltaic Solar Energy: From Fundamentals to Applications”, edited by Angèle Reinders and Pierre Verlinden, Wiley-Blackwell (2017) ISBN-13: 978-1118927465.

Park et al., APbI3 (A = CH3NH3 and HC(NH2)2) Perovskite Solar Cells: From Sensitization to Planar Heterojunction, Organic-Inorganic Halide Perovskite Photovoltaics: From Fundamentals to Device Architectures 2016.

Pavlovetc et al, “Suppressing Cation Migration in Triple-Cation Lead Halide Perovskites”, ACS Energy Lett. 2020, 5, 2802.

Gaspar D.J., et al., “OLED Fundamentals: Materials, Devices, And Processing Of Organic Light-Emitting Diodes,” 2015, p. 195.

Haber J., “Manual on Catalyst Characterization (Recommendations 1991),” Pure and Applied Chemistry, 1991, vol. 63, No. 9, pp. 1227-1246.

Kieslich G., et al., “An Extended Tolerance Factor Approach for Organic-Inorganic Perovskites,” Chemical Science, 2015, vol. 6, pp. 3430-3433.

Maissel L.I., et al., “The Handbook Of Thin Film Technology,” 1970, Chapter 1, Section 6a, p. 65.

Neubert T., et al., “Optical Thin Films And Coatings,” 2013.

Rouquerol J., et al., “Recommendations for the Characterization of Porous Solids (Technical report),” Pure and Applied Chemistry, 1994, vol. 66, No. 8, pp. 1739-1758.

Shannon R.T., et al., “Effective Ionic Radii In Oxides And Fluorides,” Acta Crystallographica Section B: Structural Science, 1969, vol. 25, No. 5, pp. 925-946.

Travis W., et al., “On the Application of the Tolerance Factor to Inorganic and Hybrid Halide Perovskites: a Revised System,” Chemical Science, 2016, vol. 7, No. 7, pp. 4548-4556.

* cited by examiner

PROCESS FOR MAKING MULTICOMPONENT PEROVSKITES

FIELD OF THE INVENTION

The present invention relates to a co-sublimation deposition process for making multicomponent perovskite thin films comprising at least 3 or 4 cations in the A position, one or two cations in the B position and one, two or more halide components, wherein fewer evaporation sources than the number of components is required. Also included in the invention is the use of a large monovalent cation additive which can be co-sublimed with another organic monovalent cation, to improve the crystallinity and thermal stability of the final perovskite material.

BACKGROUND OF THE INVENTION

Solar energy conversion is one of the most promising technologies to provide renewable energy.

One class of photovoltaic materials that has attracted significant recent interest has been organic-inorganic halide perovskites. Materials of this type have a perovskite crystal structure with general formula $ABX_3$. These materials have been found to exhibit favourable bandgaps, high absorption coefficients and long diffusion lengths, rendering such compounds ideal as an absorber in photovoltaic devices.

Typical techniques for synthesising perovskite thin films can range from wet solution-processes, such as spin-coating, inkjet, and blade coating, or alternatively, dry processes such as evaporative methods including thermal evaporation, chemical vapour deposition (CVD) and aerosol-assisted CVD, etc. Dry processes such as vapour deposition are an ideal solvent-free technique to minimise damaging pre-existing device layers and better controlling film thickness and homogeneity. Often wet process methods are employed for making complex multicomponent perovskite compositions, as dry processes tend to become more complex when further components are introduced into the perovskite structure. In particular, co-evaporation vacuum deposition techniques can become a challenge to control for perovskites comprising several different components (for instance, more than 4). Such multicomponent perovskites require a multitude of evaporation sources, each with their own settings to be monitored, alongside meticulous control over the various deposition rates for each corresponding precursor, incurring an overall complex and expensive process, especially when one or more precursors are sublimed in the same source.

Attempts to overcome such practical complexities were reported by Kam et al. "Efficient Mixed-Cation Mixed-Halide Perovskite Solar Cells by All-Vacuum Sequential Deposition Using Metal Oxide Electron Transport Layer", Solar RRL, Vol. 3, 7, 2019. This paper discusses the preparation of a mixed perovskite using a vapour deposition process which entailed a single Quartz Crystal Microbalance (QCM) first step to deposit the lead halide and subsequently deposit the organic iodide, rather than multiple source co-evaporation. Initially $PbI_2$ and $PbBr_2$ salts were mixed in an optimized ratio and evaporated together by a heating current and subsequently deposited onto a substrate. Secondly, methylammonium iodide (MAI) and formamidinium iodide (FAI) were also mixed in an optimized ratio and jointly co-sublimed due to their similar sublimation temperatures, allowing for similar deposition rates onto the corresponding mixed lead halide film. Although a multi-component perovskite was successfully synthesised, the introduction of extra steps rather than a single simultaneous deposition does not address the issue of executing a simplified "all-in-one" co-evaporation process, which advantageously accelerates the processing times and can aid in maintaining homogeneity of the final perovskite material.

Moreover, Ball et al. "Dual-Source Coevaporation of Low-Bandgap $FA_{1-x}Cs_xSn_{1-y}Pb_yI_3$ Perovskites for Photovoltaics", ACS Energy Lett. 2019, 4, 11, 2748-2756, 2019, provided a method of dual-source co-evaporation to make a multicomponent perovskite, namely $FA_{1-x}Cs_xSn_{1-y}Pb_yI_3$. A mixture of metal iodides of Cs, Pb and Sn cations were prepared in a single-crucible source, melted under an inert atmosphere, and then allowed to cool naturally to room temperature. $SnF_2$ was also incorporated into this mixture to regulate crystallization and inhibit the formation of impurity phases in the final films. Separately, FAI was provided in a second source. The two sources were then co-evaporated, producing a crystalline low-bandgap perovskite thin film. Though able to minimise the number of evaporation sources down to only two to make a five-component perovskite, typically perovskites of this type suffer poor stability, particularly owing to the Sn component being more prone to oxidation. $SnF_2$ is a well-known passivator, providing a surplus of $Sn^{2+}$ ions to compensate the oxidised $Sn^{4+}$. However, this material does not necessarily improve the thermal stability—a key challenge for most complex perovskites. Therefore there still remains a need to optimise the processing to arrive at a stable perovskite.

Previous studies regarding vacuum deposition of a wide bandgap triple-cation perovskite via 4-source co-sublimation have been carried out by Gil-Escrig et al, (Vacuum Deposited Triple-Cation Mixed-Halide Perovskite Solar Cells, Advanced Energy Materials, Vol. 8, Issue 14, 2018). In particular, it was shown that $Cs_{0.5}FA_{0.4}MA_{0.1}Pb(I_{0.83}Br_{0.17})_3$ perovskite films can be prepared from $PbI_2$, CsBr, FAI, and MAI, wherein CsBr was the source of both Cs+ and Br−. However, in order to increase the bandgap ($E_g$>1.7 eV), a substantial amount of $Br^-$ had to be incorporated, resulting in an equally large caesium concentration, which caused an irregular morphology and resultant poor device performance. Thus, choosing the precursors of the mixed halide components requires careful consideration. Hence, mixing two different metal halides in a single source is preferable to better control the stoichiometry. As such, further research similar to Gil-Escrig et al., was conducted by Muñoz et al., ("Room temperature vacuum-deposition of $CsPbI_2Br$ perovskite films from multiple-sources and mixed halide precursors", Chem. Mater., 32, 8641, 2020) wherein the precursors $PbI_2$ and $PbBr_2$ were instead pre-mixed, meanwhile CsI was used as the caesium source. The process produced homogeneous $CsPbI_2Br$ perovskite films, however, their thermal stability was found to be significantly inadequate. Thus, controlling all parameters of the perovskite film can be challenging, despite using the co-evaporation process of mixed halide. Often, another feature such as additive engineering is necessary to overcome the deficiency in stability.

Otalora et al., "Hybrid perovskite films deposited by thermal evaporation from a single source" J Mater Sci: Mater Electron, 2021, provides a method of depositing a $MAPbI_3$ film via thermal evaporation from a single source. However, this method only supports the deposition of a very simple perovskite with only one type of A, B and X ion. Further, very specific pressures, temperatures and solvents had to be investigated to ensure preferable morphological and electrical properties similar to that of co-evaporation from two sources, were achieved.

Additive engineering to improve stability characteristics of perovskites is well tried in the art. Recent focus has veered towards large cation additive engineering, such as the partial substitution of A cation sites with guanidinium (GA) ions. For example, Jodlowski et al. "Large guanidinium cation mixed with methylammonium in lead iodide perovskites for 19% efficient solar cells", Nature Energy, 2, 927-9279, 2017, inserted GA into some of the A units of the $MAPbI_3$ structure during a spin-coating process, yielding a perovskite with enhanced thermal and environmental stability, owing to the availability of H bonds with favourable orientation within the inorganic framework. Building on this, Zhang et al. "Guanidinium induced phase separated perovskite layer for efficient and highly stable solar cells", J. Mater. Chem. A, 2019, 7, 9486-9496, spin-coated a complex quadruple cation perovskite, $Cs_{0.5}(FA_{0.83}(MA_{1-x}GA_x)_{0.17})_{0.95}Pb(I_{0.83}Br_{0.17})_3$, also displaying enhanced stability characteristics. Tuning the content of GA induced a phase-separation of the 3D $CsFAMA_{1-x}GA_x$ and hexagonal $\delta$-$FAPbI_3$. The GA based perovskite was reported to have minimal hysteresis and superior optoelectronic properties.

Similarly, Yerramilli et al., ("Phenyl Ethylammonium Iodide introduction into inverted triple cation perovskite solar cells for $V_{oc}$ and stability", Organic Electronics, 93, 2021") found that incorporating phenyl ethylammonium (PEA) into an FAMACs-based perovskite composition, improved the morphology of the film by providing a uniform film with very few pinholes. A one-step solution-based method is used to synthesise the perovskite film.

While additive engineering is a useful technique for solution-processed perovskites, this kind of structural effect is often not reproducible by sublimation techniques. For example, La-Placa et al. "Vacuum-deposited 2D/3D perovskite heterojunctions", ACS Energy Lett. 2019, 4, 12, 2893-2901, demonstrated the fabrication of perovskites via dual-source vacuum deposition, also employing large cation additive engineering with phenethyl ammonium. The method involved co-sublimation deposition of phenethyl ammonium lead iodide (PEAI) and $PbI_2$ to form a 2D layer either side of a 3D MAPI layer of $PEA_2PbI_4$. As a result, a 2D iodide ($PEA_2PbI_4$) formed a layer either side of a 3D $MAPbI_3$ film. However, non-favourable orientation of the 2D perovskite with respect to the MAPI likely lead to hindered charge extraction and no evidence of surface passivation compared to the counterpart solution-processed method.

SUMMARY OF THE INVENTION

According to a first aspect of the invention, there is provided a method as outlined in claim 1.

Increasing the number of components (specifically the number of A cations, and/or X halides) in the $ABX_3$ (B=Pb, Sn) perovskite formulation brings advantages in terms of material/device performance and environmental stability. However, vacuum co-evaporation requires increasing the number of evaporation sources accordingly, which would in turn increase the complexity of the deposition process.

The present invention provides for the synthesis of a high-performing multicomponent perovskite via a streamlined co-evaporation process with fewer sources required than components present, which further facilitates partial substitution of A sites with large cationic additives for imparting enhanced thermal stability. Accordingly, the described process and its corresponding perovskites are suitable for use in semiconductor devices such as photovoltaic devices, single junction solar cells or multi-junction solar cells including perovskite-silicon tandem cells, all-perovskite tandem solar cells, perovskite-perovskite-silicon cells, perovskite-CdTe tandem cells, perovskite-CuZnSnSSe tandem cells, perovskite-CuZnSnS tandem cells, and perovskite-CIGS tandem cells.

In the literature one can find the solution to thermal instability applied to solvent processed perovskites. However, in many cases these solutions do not lead to the same effect in perovskites prepared by sublimation (see for example the effect of adding large cations, that form quasi-2D perovskites at the surface of solution processed perovskites, but do not do this when prepared via sublimation, ref. ACS Energy Lett. 2019, 4, 12, 2893-2901).

The process of the present invention provides a clear solution to the problems experienced in the art; the ability to impart improved thermal stability through additive engineering, whilst maintaining a crystalline single-phase perovskite structure through an efficient and manageable simultaneously operated vacuum deposition process.

BRIEF DESCRIPTION OF THE FIGURES

The present invention will now be more particularly described by way of example only with reference to the accompanying drawings, in which.

DETAILED DESCRIPTION OF INVENTION

Figure 1:
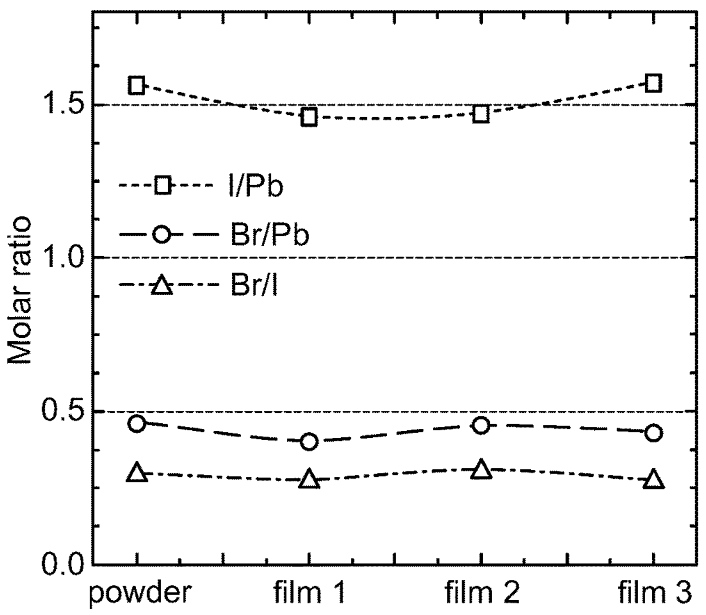
FIG. 1 illustrates the elemental and stoichiometry analysis for mixed lead halide $Pb(I_{1-x}Br_x)_3$ material after melting and for subsequently deposited films as a single precursor.

The process of the invention may comprise 3 or 4 evaporation sources, wherein some of these sources contain a mixture of multiple precursors. The resultant perovskite material $ABMX_3$ comprises three or more different cations (in A sites, i.e. present as A, A', A") in addition to the B cation(s).

The invention provides a method which reduces the number of sources which can be used by co-subliming organic halides, wherein preferably one of the organic halides comprises an organic monocation and the other a larger organic cation (hereinafter alternatively referred to as a "cation additive"). In another aspect of the invention, the number of sources can be even further reduced by preparing mixed inorganic/metal halide precursors, for example CsI+CsBr or $PbI_2$+$PbBr_2$. The process of the invention can be divided into multiple steps, as outlined below. The multiple steps involve co-subliming from multi-sources. By co-subliming, it is meant that the various components from each evaporation source are sublimed together, or simultaneously, so that there is at least some overlap between the sublimation from each source.

The process of the invention is typically carried out under vacuum, generally by vacuum deposition onto a substrate. This may be carried out in a vacuum chamber under $N_2$ atmosphere. The chamber may be equipped with individual evaporation sources, which may, for instance, have their own independent temperature controllers and shutters. Each source may have its own dedicated QCM sensor above and an additional one installed close to the substrates to measure the overall deposition rate. The temperature of the process is bespoke to each chamber and may, for instance, range from 100° C. to 500° C., with a consistent pressure of approximately $10^{-6}$ mbar.

Step (i)

Step (i) of the method of the invention makes use of a first evaporation source comprising a mixture of co-sublimable organic halides which are sublimed (transformed from a solid to a gas) together. Generally, the co-sublimable organic halides have similar co-sublimation temperatures. The term "similar co-sublimation temperatures", as used herein, refers to two distinct precursors (e.g. organic halides) which can be placed in the same evaporation source to deposit a final single phase material, owing to a degree of closeness in their sublimation temperatures. Co-sublimation (or co-evaporation) is further explained in the textbook "OLED Fundamentals—Materials, Devices, and Processing of Organic Light-Emitting Diodes" (edited by Daniel J. Gaspar and Evgueni Polikarpov, 2015, pg 195), wherein it is explained that co-evaporation depends on the evaporation temperatures of the two or more materials and that the ratio of each material is controlled by the respective rates of evaporation.

Similar co-sublimation temperatures can refer to both "congruent evaporation" and "non-congruent" evaporation. "Congruent evaporation" refers to precursors which have been mixed together and have a close sublimation temperature within 20° C. (and preferably within 15° C. or within 10° C.) of each other, such that they effectively evaporate as a single phase. Alternatively, the materials may be mixed together to form a new material or alloy that then congruently evaporates at a different temperature from the independent entities.

The Handbook of Thin Film Technology (edited by Leon I. Maissel and Reinhard Glang, 1970, Chapter 1, pg. 65, section 6a) provides a general understanding for the term "congruent evaporation" in the art. That is, the deposition of compound films from a single vapour source requires that the material enters the gaseous state in the form of complete molecules. Alternatively, if the molecules dissociate, congruent evaporation occurs if the constituents are equally volatile. Thus, as discussed above, the evaporation occurs via a single phase and is dependent on the identity and properties of each precursor.

"Non-congruent evaporation" refers to precursors which are present in the same crucible but are not necessarily mixed to form a single entity, i.e. the precursors exist as two distinct phases such that they do not enter the gaseous state as complete molecules in a single vapour phase or are not equally volatile to dissociate congruently. These precursors can be heated separately and thus only require a closeness of 50-150° C. in respective sublimation temperatures. While they are heated, the vapour stream of the two phases mixes to form the first evaporation source. For example, a crucible containing two precursors could be heated across a range of temperatures covering the evaporation temperatures of the respective precursors to ultimately allow their co-evaporation, but as distinct vapour phases.

Preferably, in step (i), one of the organic halides comprises an A monocation such as formamidinium (i.e. A is FA) and the other comprises a cation A' which has an ionic radius greater than that of the first organic cation A, which is preferably formamidinium (FA). In other words, the ionic radius of organic cation A' is preferably greater than 2.53 Å (and is herein after referred to as a large monocation or a large cation additive). The respective radii for organic cations in perovskite environments ca be found in Cheetham et al., Chem. Sci., 2015, 6, 3430 and Travis et al., Chem. Sci., 2016, 7, 4548-4556. Further, Shannon et al. Acta Cryst. (1969), B25, 925-945, outlines methods for determining effective ionic radii, providing the radii for various elements in different coordination environments, such as for Pb and Cs. These resources can thus be useful in calculating the Goldschmidt tolerance factor to estimate the stability and distortion of perovskite structures.

Preferably the A cation is a monovalent organic cation which is co-sublimable with A' when both organic cations A and A' are present as halides (typically, iodides). Preferably A has a similar sublimation temperature to A' when present as a halide. Further preferably, A is selected from FA and MA. Even more preferably, A is FA. The respective organic halide of the A cation typically comprises a halide anion, and is, for instance, FAI.

Preferably the A' cation is a monocation, typically a large monocation. A' may be an ammonium-based organic cation, typically selected from the group consisting of Guanidinium (GA), Dimethylammonium (DMA), Ethylammonium (EA), Imidazolium (Im), Phenylethylammonium (PEA), Acetamidinium (Ac) and Benzylammonium (BzA). Most preferably A' is GA. The respective organic halide typically comprises an iodide anion, and is, for instance, GAI.

It has been found that this large organic halide can be mixed (for instance manually, by speed-mixing or ball-milling) with the first organic halide, such as an organic ammonium salt, and the two-component material can be sublimed from the same evaporation source. In a preferred embodiment the co-sublimation of the two precursors is congruent.

In an alternative embodiment, the co-sublimation is non-congruent. In this embodiment, the monovalent organic A cation may be methyl ammonium (MA).

By co-subliming an organic halide with a large ammonium salt, for instance guanidinium iodide (GAI), a temperature stable perovskite with multiple components can be prepared. This is unexpected as such large cations generally do not fit in the A cation site reserved in 3D perovskites, but would usually incur major lattice distortions and exacerbate halide segregation.

The large monovalent organic cation with an ionic radius of greater than 2.53 Å and the smaller monovalent organic cation are typically provided as halides in the first evaporation source, and are co-evaporated. This is facilitated by a close sublimation temperature and similar deposition rate of the two cation components, as shown by Table 1.

For example, a suitable combination of precursors in the first evaporation source may be FAI and GAI, or FABr and GABr.

All of these organic halides are commercially available in their solid powder form. These cationic salts are in solid form and can be mixed together before the evaporation step by any mechanical means including manual grinding such as ball-milling or speed-mixing. At the stage of evaporation, the two salts can be sublimed from the solid to vapour phase for deposition onto a substrate.

As reported by Unlu et al. "Understanding the interplay of stability and efficiency in A-site engineered lead halide perovskites", APL Materials 8, 070901, 2020, partial occupation of the A sites in a perovskite with large cations such as GA impacts the structural stabilization of the overall perovskite structure. For example, GA increases the number of Hydrogen bonding (H—X bonds) interactions than other cations such as MA or FA. The available H—X bonds interact with the inorganic framework, which directly improves the thermal stability. The H-bonding may also enhance the grain size, charge carrier transport, and passivate uncoordinated halide ions within the grain boundaries, thus improving the crystallinity and electronic properties of the perovskite. Although one would expect crystal distortions to be imposed by the large cation, the localized MA cations in neighbouring cavities preserve the 3D structure.

Perovskites can generally be represented by the formula $AMX_3$ or $ABX_3$. The use of a large cation in the A-site evidently demonstrates stabilization benefits to a perovskite structure. However, the combined vacuum deposition of a large monovalent cation coupled with a smaller monovalent cation has not been demonstrated, likely because it is not expected that the larger cation will enter the A-site of the perovskite lattice via sublimation methods. Vacuum deposition is a particularly attractive technique since not only can the quality of the perovskite film be better controlled, but the scalability of the technique favours this approach for large-scale industrial fabrication.

Accordingly, the present invention surprisingly demonstrates that large cations can in fact be co-sublimed with the smaller monovalent organic cations, such as FA, producing a thermally stabilized and crystalline perovskite structure.

TABLE 1

| Organic iodide | Ionic Radius of cation (Å) | Sublimation Temperature (° C.) |
|---|---|---|
| FAI | 2.53 | 160-180 |
| GAI | 2.78 | 160-170 |
| DMAI | 2.72 | 160-170 |

Exemplary list of organic halides and their corresponding vacuum deposition rates and sublimation temperatures The sublimation temperatures provided in Table 1 are an estimated range, but these are variable subject to the source, crucible type, type of temperature measurement, chamber, pressure and thermocouple positions where evaporation is observed on a QCM.

Step (ii)

The second evaporation source may comprise a single metal halide $BX_2$. Preferably, the second evaporation source comprises two metal halides, namely $BX_2$ and $BX'_2$, which have typically been mixed together in a crucible in a preceding step and heated under inert atmosphere, such as $N_2$, at temperatures exceeding the highest melting point of any elected precursor until they have formed a melt. The melt is then allowed to recrystallize at room temperature wherein a solid mixed halide single phase precursor is formed. The halide stoichiometries of the final mixed halide precursor phase can be determined by the initial ratios of $BX_2$ and $BX'_2$. When the stoichiometrically mixed precursors form a single mixture, congruent evaporation will then usually maintain the initial ratios. In an alternative embodiment, two different metal halides may be combined in the same evaporation source without the need for a preceding step, whereby they are non-congruently co-evaporated. Table 2 provides a list of the deposition rates and melting temperatures of the corresponding bromides and iodides of some preferred metal halides. The compounds listed in Table 2 can all be purchased in their desired solid form from Sigma Aldrich ready for pre-treatment heating together, if necessary, to form a single precursor phase.

TABLE 2

| Metal Halide | Melting Temperature (° C.) | Sublimation Temperature (° C.) |
|---|---|---|
| $PbI_2$ | 402 | ~400 |
| $PbBr_2$ | 373 | ~300 |
| $PbCl_2$ | 501 | ~450 |

List of lead halides and their corresponding vacuum deposition rates and melting temperatures In other words, in step (ii) of the process of the invention, a second evaporation source is provided which comprises one or more halides having the formula (I):

$$B(X_yX'_{1-y})_2 \quad (I)$$

wherein B is a divalent metal cation, X and X' are different halides and $0 \leq y < 1$.

In a step that precedes step (ii), we have found that two metal halide salts can react to form a new single mixed halide component that sublimes as one new material. This step generally involves mixing one or more metal halides, such as $BX_2$ and/or $BX'_2$ and heating in an inert atmosphere. Preferably this step forms $PbI_yBr_{1-y}$, which step is preceded by mixing $PbBr_2$ and $PbI_2$ and heating in an inert atmosphere.

Optionally the B cation is different for each halide precursor, such that $BX_2$ and $B'X'_2$ or $BX_2$ and $B'X_2$ is mixed to give formula (IA) $B_xB'_{1-x}(X_yX'_{1-y})_2$, wherein B and B' are different and $0<x<1$ and $0 \leq y<1$.

B and B' are preferably selected from Sn and Pb.

In this instance, in step (ii) the second evaporation source may comprises two mixed-metal halides selected from:

a) $PbI_2$ and $SnI_2$ to give a single precursor phase $Pb_xSn_{1-x}I_2$;

b) $PbBr_2$ and $SnBr_2$ to give a single precursor phase $Pb_xSn_{1-x}Br_2$;

c) $PbI_2$ and $SnBr_2$ to give a single precursor phase $Pb_xSn_{1-x}(I_{1-y}\,Br_y)_2$; and d) $PbBr_2$ and $SnI_2$ to give a single precursor phase $Pb_xSn_{1-x}(I_{1-y}\,Br_y)_2$ wherein $0<x<1$ and $0 \leq y<1$.

In the embodiment, wherein y>0 in step (ii), two different metal halides are mixed (i.e. the halide components are not the same).

The metal halide salts may be lead halide salts, for instance $PbI_2$ and $PbBr_2$ or $PbBr_2$ and $PbCl_2$. The metal halide salts may be mixed at elevated temperature in ambient pressure. This advantageously enables a reduced number of evaporative sources to be used.

The preparation may involve mixing the two materials in a crucible and melting them at high temperature (>350° C.) at ambient pressure in nitrogen atmosphere, to avoid oxidation. The resulting compound is mainly composed of a new mixed halide phase, which can be sublimed as a single component in a co-evaporation process.

In one embodiment, the final perovskite may comprise three different halide materials. The third halide may be introduced from an additional metal halide co-evaporation source. Alternatively, the third metal halide may also be pre-mixed with two other metal halides in a crucible and heated under an inert atmosphere to either congruently or non-congruently evaporate and deposit onto the substrate. Preferably, the third halide is selected from $PbI_2$, $PbBr_2$, $PbCl_2$, $SnI_2$, $SnCl_2$, $SnBr_2$ or $SnF_2$.

In another embodiment, an additional metal halide precursor with a different halide component to that/those of formula (I) $B(X_yX'_{1-y})_2$ may be included in the process as an additive. This additional halide component is not present in the final perovskite formula. Preferably, the additional metal halide precursor acting as an additive is $PbCl_2$. These additives can suitably be incorporated into any other embodiment described herein Step (iii)

Optional step (iii) of the method of the invention comprises the provision of a preferably monovalent organic halide (such as MAI) in the third evaporation source. This may be accompanied by the optional step (iv) of a fourth evaporation source which may comprise an inorganic halide, such as CsI or CsBr. At least one of steps (iii) or (iv) must be present and accordingly there may be three or four evaporation sources, i.e. steps (i), (ii) and (iii); steps (i), (ii) and (iv) or steps (i), (ii), (iii) and (iv). In one embodiment, step (iii) is absent and step (iv) is present, and thus the inorganic halide is provided in a third evaporation source to produce a triple cation perovskite.

There may accordingly be 3 or 4 A-site cations in the perovskite material.

The organic portion of the organic halide in step (iii) is preferably selected from MA and FA. The halide portion is preferably selected from I, Br and Cl. The organic halide in step (iii) is typically different to the organic halides used in step (i).

The three or four evaporation sources can be co-evaporated simultaneously to produce a final single phase perovskite film. The term simultaneous co-evaporation means that evaporation from each source-should occur at substantially the same time. Upon evaporation, the plumes from each source may have at least 10% of overlap with each other, preferably at least 20% overlap, more preferably at least 30%, 40%, 50%, 60%, 70%, 80%, 90% or substantially complete (100%) overlap. When the second evaporation source comprises $BX_2$, this may be directly sublimed at the co-evaporation stage (ii) without any prior preparatory steps with another precursor. In one embodiment, step (iv) may comprise CsI or CsBr to produce a single or mixed halide final material. Where a final single halide material is desired, the halide component of the Cs halide may be the same as that of the lead halide of step (ii). Where a final double mixed halide with a preferred stoichiometry is desired and step (ii) only comprises $BX_2$, there are two routes to which a mixed double halide composition can be achieved. In one embodiment a preferred stoichiometric ratio of $BX_2$ and CsX' may be evaporated according to their steps and separate sources, wherein X and X' are different halides. In another embodiment, the mixed halide components are derived from a preceding preparation step of (iii) or (iv), e.g. from a mixture of two inorganic halides, wherein one has a different halide component to the material(s) of step (ii).

Where a final triple mixed halide with a preferred stoichiometry is desired and step (ii) only comprises $BX_2$, and $BX'_2$, there are two routes to which a mixed triple halide composition can be achieved. In one embodiment a preferred stoichiometric ratio of $BX_2$, $BX'_2$ and CsX" may be evaporated according to their steps and-separate sources, wherein X, X' and X" are different halides. In another embodiment, the triple mixed halide components are derived from a preceding preparation step of (iii) or (iv), e.g. from a mixture of two inorganic halides, wherein both have a different to the halide component to the materials of step (ii).

The preferred inorganic halides, CsI and CsBr, are mixed together in a crucible and heated under inert atmosphere, such as $N_2$, at temperatures exceeding the highest melting point of any elected precursor until they have formed a melt. The melt is then allowed to recrystallize at room temperature wherein a solid mixed halide single phase precursor is formed. The halide stoichiometries of the final mixed halide precursor phase can be determined by the initial ratios of CsBr and CsI. Table 3 provides the melting temperatures and deposition rates of the CsI and CsBr compounds, highlighting the closeness in their sublimation temperatures and identical deposition rates. The Cs mixed halide precursor therefore occupies a third evaporation source which is co-sublimed with the first and second evaporation sources.

Optionally, a fourth evaporation source may be introduced also, wherein the fourth evaporation source may comprise an inorganic halide, such as CsI or CsBr, and the third evaporation source may comprise an organic halide selected from organic monocations, such as MA and FA cations, whereby none of the precursor organic cations in the method are the same.

In another embodiment of the present invention, the second evaporation source in step (ii) may instead be comprised from the preparation of two mixed metal mixed halide reagents, such as $BX_2$ and $B'X'_2$. For example, $PbI_2$ and $SnBr_2$, or equally $PbBr_2$ and $SnI_2$, could be mixed in a crucible and melted at the temperature according to the highest melting point of any of the precursors under an inert atmosphere, such as $N_2$ to form a melt. The melt is then allowed to recrystallize at room temperature, wherein a solid mixed halide mixed metal single phase precursor is formed. The halide and metal stoichiometries of the final precursor phase can be determined by the initial ratios of $BX_2$ to $B'X'_2$.

As for the afore-mentioned embodiment, a third or fourth evaporation source may comprise an inorganic halide, such as CsI or CsBr, or an organic halide selected from MA and FA cations, whereby none of the precursor organic cations are the same.

The Cs salts can be directly sourced from standard suppliers in their powdered form, ready for pre-treatment to form a single precursor phase.

Step (iv)

Step (iv) may comprise the introduction of an inorganic halide component. Step (iii) may, or may not be present and accordingly there may be three or four evaporation sources. Optionally, where four evaporation sources are used, an inorganic halide is provided in a fourth evaporation source, and an organic halide is provided in the third evaporation source, wherein all A cations are different from each other in the final composition.

The inorganic portion of the inorganic halide component is preferably selected from Cs and Rb, and is preferably Cs.

Accordingly, the process may comprise 4 evaporation sources wherein in step (ii) $BX_2$ is provided in an evaporation source and in step (iv) the mixed Cs halides are provided in a fourth evaporation source and the organic halide is provided in the third evaporation source.

In this embodiment, a fourth evaporation source may be employed to deposit a quadruple cation perovskite, which comprises an organic halide selected from organic monocations, such as MA, FA and EA cations, preferably MA, whereby none of the precursor organic cations are the same.

In yet another embodiment, the second evaporation source may be comprised of the preparation of $BX_2$ and $B'X_2$ to give a mixed metal same halide precursor. For example any two of $PbCl_2$, $PbBr_2$, and $PbI_2$, or any two of $SnCl_2$, $SnF_2$, $SnBr_2$, and $SnI_2$ could be mixed in a crucible and may be melted at the temperature according to the highest melting point of any of the precursors under an inert atmosphere, such as $N_2$ to form a melt. The melt is then allowed to recrystallize at room temperature, wherein a solid mixed metal single phase precursor is formed. The metal stoichiometries of the final precursor phase can be determined by the initial ratios of $BX_2$ to $B'X_2$.

As in step (iii) when the second evaporation source simply comprises a single halide, step (iv) may comprise CsI or CsBr to produce a single or mixed halide final material. Where a final single halide material is desired, the halide component of the Cs halide is the same as that of the lead halide of step (ii). Where a final mixed halide with a preferred stoichiometry is desired, there are two routes to which a mixed halide composition can be achieved. In one embodiment a preferred stoichiometric ratio of $BX_2$ and CsX' may be evaporated in their separate steps and chambers, wherein X and X' are different halides. In another embodiment, the mixed halide components are derived from a preceding preparation step of (iv), e.g. from a mixture of inorganic halides.

The preferred inorganic halides, CsI and CsBr, may be mixed together in a crucible and heated under inert atmosphere, such as $N_2$, at temperatures exceeding the highest melting point of any elected precursor until they have formed a melt. The melt is then allowed to recrystallize at room temperature wherein a solid mixed halide single phase precursor is formed. The halide stoichiometries of the final mixed halide precursor phase can be determined by the initial ratios of CsBr and CsI. The Cs mixed halide precursor therefore occupies a third (or fourth) evaporation source which is co-sublimed with the first and second to deposit a triple or quadruple cation double halide perovskite film onto a substrate.

Optionally, a further evaporation source may also be employed (in step (iii)), which comprises an organic halide selected from MA cations, whereby none of the precursor organic cations are the same.

TABLE 3

| Metal Halide | Melting Temperature (° C.) | Sublimation Temperature (° C.) |
|---|---|---|
| CsI | 626 | ~500 |
| CsBr | 636 | ~400 |

List of caesium halides and their corresponding melting and sublimation temperatures.

The temperatures listed in Tables 1 to 3 are for reference only and are naturally subject to change when the process is scaled up. Similarly, deposition rates for each precursor will be largely influenced by the temperatures and pressures employed and therefore may also change upon scale-up (T. Neubert, M. Vergöhl, Optical Thin Films and Coatings, 2013).

For all embodiments, the multicomponent perovskite has a preferred thickness of 50 to 2000 nm, preferably 100 nm to 1500 nm, governed by the deposition rate of each respective precursor under vacuum conditions at below atmospheric pressure. Once the perovskite film has been deposited onto the substrate, the film can subsequently be annealed at a temperature in the range of 50 to 300° C. for between for instance 1 minute to 6 hours to promote and ensure crystalline films with uniform morphology, whereby the large additive cations have successfully entered the perovskite lattice. The specific process conditions may influence the quantity of large cations which enter the lattice. However, within the recommended temperature range, at least some incorporation of the large cations can be expected. The large cations may also in some cases act as defect passivating additives at grain boundaries and surfaces, and thus are not incorporated into the final perovskite formula. These passivating additives can suitably be incorporated into any other embodiment described herein.

Material

Typically, the method of the invention comprises the formation of a thin film perovskite material, wherein the bandgap is typically between 1.1 eV and 2.5 eV.

The perovskite material preferably is a mixed halide material, i.e. contains two or more different halides. It may contain two different halides. Alternatively, there may be three different halide anions present.

The perovskite material formed by the method of the invention typically has the formula (II):

$$A_aA'_bA''_cA'''_dB_xB'_{1-x}(X_yX'_{1-y})_3,$$

wherein;

A is a first monovalent organic cation which is co-sublimable with A' when both organic cations A and A' are present as halides (preferably, iodides);

A' is a second monovalent organic cation;

A'' and A''' are independently a monovalent inorganic cation or a further monovalent organic cation;

wherein all A cations are different from each other and at least three of them are present;

$$0<a<1$$

$$0<b<1$$

$$0<c<1$$

$$0\le d<1$$

$$a+b+c+d=1$$

$$0\le x<1;\ \text{and}\ 0\le y<1;$$

B and B' are independently divalent metal cations; and X and X' are halide anions.

In a preferred embodiment, the perovskite material formed by the method of the invention has the following formula:

$$A_aA'_bA''_cA'''_dB_xB'_{1-x}(X_yX'_{1-y})_3, \quad \text{(III)}$$

wherein;

A is a monovalent organic cation which is co-sublimable with A' when present in a halide;

A' is a monovalent organic cation having an ionic radius greater than 2.53 Å;

A" is a monovalent inorganic cation or a monovalent organic cation;

and A'" is a monovalent inorganic cation or a monovalent organic cation;

wherein all A cations are different from each other and;

$$0 < a < 1$$
$$0 < b < 1$$
$$0 < c < 1$$
$$0 \leq d < 1$$
$$a + b + c + d = 1$$
$$0 \leq x < 1$$
$$\text{and } 0 \leq y < 1.$$

In both of these embodiments, preferably $0<y<1$, i.e. the halide components are different.

A is a monovalent organic cation having a similar sublimation temperature to A' when present as a halide, preferably iodide. The halide portion is selected from X or X' as in the final product of formula (II).

In a preferred embodiment, A is FA. In a further preferred embodiment, A' is selected from guanidinium (GA), dimethylammonium (DMA), benzylammonium (BzA), Ethylammonium (EA), Imidazolium (Im), Acetamidinium (Ac) and Phenylethylammonium (PEA), preferably wherein A' is GA.

A" and A'" are also different to each other and may be selected from any of:

(i) A group of organic cations typically comprising MA, FA, EA, preferably MA and/or;

(ii) A Cs ion.

The X and X' anions are also different from each other and selected from a group of halides comprising: Cl, Br and I, preferably wherein the halides are I and/or Br.

The B cation is selected from $Pb^{2+}$ and $Sn^{2+}$, wherein B' is different from B and also selected from $Pb^{2+}$ and $Sn^{2+}$.

In one embodiment the method may comprise 3 evaporation sources, wherein in step (ii) of the process, one or more metal halides are provided in a single source, and in (iii) of the process, either an inorganic halide or organic halide is provided in a third evaporation source, yielding a triple cation perovskite.

Such perovskites may be selected from the formulae:

$FA_aGA_bMA_cPb(I_yBr_{1-y})_3$, $FA_aGA_bCs_cPb(I_yBr_{1-y})_3$, $MA_aGA_bCs_cPb(I_yBr_{1-y})_3$, $FA_aBzA_bMA_cPb(I_yBr_{1-y})_3$, $FA_aBzA_bCs_cPb(I_yBr_{1-y})_3$, $MA_aBzA_bCs_cPb(I_yBr_{1-y})_3$, $FA_aDMA_bCs_cPb(I_yBr_{1-y})_3$, $FA_aDMA_bMA_cPb(I_yBr_{1-y})_3$, $MA_aDMA_bCs_cPb(I_yBr_{1-y})$, $FA_aGA_bMA_cSn(I_yBr_{1-y})_3$, $FA_aGA_bCs_cSn(I_yBr_{1-y})_3$, $MA_aGA_bCs_cSn(I_yBr_{1-y})_3$, $FA_aBzA_bMA_cSn(I_yBr_{1-y})_3$, $FA_aBzA_bCs_cSn(I_yBr_{1-y})_3$, $MA_aBzA_bCs_cSn(I_yBr_{1-y})_3$, $FA_aDMA_bCs_cSn(I_yBr_{1-y})_3$, $FA_aDMA_bMA_cSn(I_yBr_{1-y})_3$, $MA_aDMA_bCs_cSn(I_yBr_{1-y})$, $FA_aIm_bCs_cPb(I_yBr_{1-y})_3$, $FA_aIm_bCs_cSn(I_yBr_{1-y})_3$, $FA_aPEA_bCs_cPb(I_yBr_{1-y})_3$ $FA_aPEA_bCs_cSn(I_yBr_{1-y})_3$, $FA_aAc_bCs_cPb(I_yBr_{1-y})_3$, $FA_aAc_bCs_cSn(I_yBr_{1-y})_3$, $FA_aBzA_bMA_cPb(I_yBr_{1-y})_3$ $FA_aBzA_bMA_cSn(I_yBr_{1-y})_3$, $FA_aIm_bMA_cPb(I_yBr_{1-y})_3$, $FA_aIm_bMA_cSn(I_yBr_{1-y})_3$, $FA_aPEA_bMA_cPb(I_yBr_{1-y})_3$, $FA_aPEA_bMA_cSn(I_yBr_{1-y})_3$, $FA_aEA_bCs_cPb(I_yBr_{1-y})_3$, $FA_aEA_bMA_cPb(I_yBr_{1-y})_3$, $FA_aEA_bCs_cSn(I_yBr_{1-y})_3$, $FA_aEA_bMA_cSn(I_yBr_{1-y})_3$, $MA_aEA_bCs_cPb(I_yBr_{1-y})_3$, $MA_aEA_bCs_cSn(I_yBr_{1-y})_3$;

wherein $0<a<1$, $0<b<1$, $0<c<1$, $a+b+c=1$ and $0\leq y<1$.

In another embodiment the method may comprise 3 evaporation sources wherein in step (ii) of the process, a mixture of metal halides, each with a different metal component are provided in a single source, and in (iii) or (iv) of the process, either an inorganic halide or organic halide is provided in a third evaporation source, yielding a triple cation mixed metal perovskite.

Such perovskites may be selected from the formulae:

$FA_aGA_bMA_cPb_xSn_{1-x}(I_yBr_{1-y})_3$, $FA_aGA_bCs_cPb_xSn_{1-x}(I_yBr_{1-y})_3$, $MA_aGA_bCs_cPb_xSn_{1-x}(I_yBr_{1-y})_3$, $FA_aBzA_bMA_cPb_xSn_{1-x}(I_yBr_{1-y})_3$, $FA_aBzA_bCs_cPb_xSn_{1-x}(I_yBr_{1-y})_3$, $MA_aBzA_bCs_cPb_xSn_{1-x}(I_yBr_{1-y})_3$, $FA_aDMA_bCs_cPb_xSn_{1-x}(I_yBr_{1-y})_3$, $FA_aDMA_bMA_cPb_xSn_{1-x}(I_yBr_{1-y})_3$, $MA_aDMA_bCs_cPb_xSn_{1-x}(I_yBr_{1-y})$, $FA_aIm_bMA_cPb_xSn_{1-x}(I_yBr_{1-y})_3$, $FA_aIm_bCs_cPb_xSn_{1-x}(I_yBr_{1-y})_3$, $FA_aPEA_bMA_cPb_xSn_{1-x}(I_yBr_{1-y})_3$, $FA_aPEA_bCs_cPb_xSn_{1-x}(I_yBr_{1-y})_3$, $FA_aAc_bMA_cPb_xSn_{1-x}(I_yBr_{1-y})_3$, $FA_aAc_bCs_cPb_xSn_{1-x}(I_yBr_{1-y})_3$, $FA_aEA_bCs_cPb_xSn_{1-x}(I_yBr_{1-y})_3$, $FA_aEA_bMA_cPb_xSn_{1-x}(I_yBr_{1-y})_3$, $MA_aEA_bCs_cPb_xSn_{1-x}(I_yBr_{1-y})_3$;

wherein $0<a<1$, $0<b<1$, $0<c<1$, $a+b+c=1$, $0<x<1$ and $0\leq y<1$.

In another embodiment the method may comprise 4 evaporation sources, wherein in step (ii) of the process, one or more metal halides are provided in a single source, and wherein in steps (iii) and (iv) of the process, the inorganic halide is provided in a fourth evaporation source and the organic halide in a third evaporation source, yielding a quadruple cation perovskite material.

Such perovskites may be selected from the formulae;

$FA_aGA_bMA_cCs_dPb(I_yBr_{1-y})_3$, $FA_aEA_bMA_cCs_dPb(I_yBr_{1-y})_3$, $FA_aBzA_bMA_cCs_dPb(I_yBr_{1-y})_3$, $FA_aDMA_bMA_cCs_dPb(I_yBr_{1-y})_3$, $FA_aGA_bMA_cCs_dSn(I_yBr_{1-y})_3$, $FA_aEA_bMA_cCs_cSn(I_yBr_{1-y})_3$, $FA_aBzA_bMA_cCs_dSn(I_yBr_{1-y})_3$, $FA_aDMA_bMA_cCs_dSn(I_yBr_{1-y})_3$, $FA_aIm_bMA_cCs_dPb(I_yBr_{1-y})_3$, $FA_aIm_bMA_cCs_dSn(I_yBr_{1-y})_3$, $FA_aPEA_bMA_cCs_dPb(I_yBr_{1-y})_3$, $FA_aPEA_bMA_cCs_dSn(I_yBr_{1-y})_3$, $FA_aAc_bMA_cCs_dPb(I_yBr_{1-y})_3$, $FA_aAc_bMA_cCs_dSn(I_yBr_{1-y})_3$;

wherein $0<a<1$, $0<b<1$, $0<c<1$, $0<d<1$, $a+b+c+d=1$ and $0\leq y<1$.

In another embodiment the method may comprise 4 evaporation sources, wherein in step (ii) of the process, a mixture of metal halides, each with a different metal component are provided in a single source, and in (iii) of the process, the inorganic halide is provided in a third evaporation source and the organic halide in a fourth evaporation source, yielding a quadruple cation mixed metal perovskite material.

Such perovskites may be selected from the formulae;

$FA_aGA_bMA_cCs_dPb_xSn_{1-x}(I_yBr_{1-y})_3$, $FA_aBzA_bMA_cCs_dPb_xSn_{1-x}(I_yBr_{1-y})_3$, $FA_aEA_bMA_cCS_dPb_xSn_{1-x}(I_yBr_{1-y})_3$, $FA_aDMA_bMA_cCS_dPb_xSn_{1-x}(I_yBr_{1-y})_3$, $FA_aIm_bMA_cCS_dPb_xSn_{1-x}(I_yBr_{1-y})_3$, $FA_aPEA_bMA_cCS_dPb_xSn_{1-x}(I_yBr_{1-y})_3$, $FA_aAc_bMA_cCS_dPb_xSn_{1-x}(I_yBr_{1-y})_3$;

wherein $0<a<1$, $0<b<1$, $0<c<1$, $0<d<1$, $a+b+c+d=1$, $0<x<1$ and $0\leq y<1$.

In a further aspect of the invention, there are provided novel perovskites of formulae:

$MA_aGA_bCs_cPb(I_yBr_{1-y})_3$, $FA_aBzA_bMA_cPb(I_yBr_{1-y})_3$, $FA_aBzA_bCs_cPb(I_yBr_{1-y})_3$, $MA_aBzA_bCs_cPb(I_yBr_{1-y})_3$, $MA_aDMA_bCs_cPb(I_yBr_{1-y})$, $FA_aGA_bMA_cSn(I_yBr_{1-y})_3$, $FA_aGA_bCs_cSn(I_yBr_{1-y})_3$, $MA_aGA_bCs_cSn(I_yBr_{1-y})_3$, $FA_aBzA_bMA_cSn(I_yBr_{1-y})_3$, $FA_aBzA_bCs_cSn(I_yBr_{1-y})_3$, $MA_aBzA_bCs_cSn(I_yBr_{1-y})_3$, $FA_aDMA_bCs_cSn(I_yBr_{1-y})_3$, $FA_aDMA_bMA_cSn(I_yBr_{1-y})_3$, $MA_aDMA_bCs_cSn(I_yBr_{1-y})$, $FA_aIm_bCs_cSn(I_yBr_{1-y})_3$, $FA_aPEA_bCs_cPb(I_yBr_{1-y})_3$, $FA_aPEA_bCs_cSn(I_yBr_{1-y})_3$, $FA_aAc_bCs_cSn(I_yBr_{1-y})_3$, $FA_aBzA_bMA_cPb(I_yBr_{1-y})_3$, $FA_aBzA_bMA_cSn(I_yBr_{1-y})_3$, $FA_aIm_bMA_cPb(I_yBr_{1-y})_3$, $FA_aIm_bMA_cSn(I_yBr_{1-y})_3$, $FA_aPEA_bMA_cPb(I_yBr_{1-y})_3$, $FA_aPEA_bMA_cSn(I_yBr_{1-y})_3$, $FA_aEA_bCs_cSn(I_yBr_{1-y})_3$, $FA_aEA_bMA_cSn(I_yBr_{1-y})_3$, $MA_aEA_bCs_cPb(I_yBr_{1-y})_3$, $MA_aEA_bCs_cSn(I_yBr_{1-y})_3$, $FA_aGA_bMA_cPb_xSn_{1-x}(I_yBr_{1-y})_3$, $FA_aGA_bCs_cPb_xSn_{1-x}(I_yBr_{1-y})_3$, $MA_aGA_bCs_cPb_xSn_{1-x}(I_yBr_{1-y})_3$, $FA_aBzA_bMA_cPb_xSn_{1-x}(I_yBr_{1-y})_3$, $FA_aBzA_bCs_cPb_xSn_{1-x}(I_yBr_{1-y})_3$, $MA_aBzA_bCs_cPb_xSn_{1-x}(I_yBr_{1-y})_3$, $FA_aDMA_bCs_cPb_xSn_{1-x}(I_yBr_{1-y})_3$, $FA_aDMA_bMA_cPb_xSn_{1-x}(I_yBr_{1-y})_3$, $MA_aDMA_bCs_cPb_xSn_{1-x}(I_yBr_{1-y})$, $FA_aIm_bMA_cPb_xSn_{1-x}(I_yBr_{1-y})_3$, $FA_aIm_bCs_cPb_xSn_{1-x}(I_yBr_{1-y})_3$, $FA_aPEA_bMA_cPb_xSn_{1-x}(I_yBr_{1-y})_3$, $FA_aPEA_bCs_cPb_xSn_{1-x}(I_yBr_{1-y})_3$, $FA_aAc_bMA_cPb_xSn_{1-x}(I_yBr_{1-y})_3$, $FA_aAc_bCs_cPb_xSn_{1-x}(I_yBr_{1-y})_3$;

wherein $0<a<1$, $0<b<1$, $0<c<1$, $0<d<1$, $a+b+c=1$, $0<x<1$ and $0<y<1$; and $FA_aEA_bMA_cCS_dPb(I_yBr_{1-y})_3$, $FA_aBzA_bMA_cCS_dPb(I_yBr_{1-y})_3$, $FA_aDMA_bMA_cCS_dPb(I_yBr_{1-y})_3$, $FA_aGA_bMA_cCS_dSn(I_yBr_{1-y})_3$, $FA_aEA_bMA_cCs_cSn(I_yBr_{1-y})_3$, $FA_aBzA_bMA_cCS_dSn(I_yBr_{1-y})_3$, $FA_aDMA_bMA_cCS_dSn(I_yBr_{1-y})_3$, $FA_aIm_bMA_cCs_dPb(I_yBr_{1-y})_3$, $FA_aIm_bMA_cCs_dSn(I_yBr_{1-y})_3$, $FA_aPEA_bMA_cCS_dSn(I_yBr_{1-y})_3$, $FA_aAc_bMA_cCS_dPb(I_yBr_{1-y})_3$, $FA_aAc_bMA_cCS_dSn(I_yBr_{1-y})_3$, $FA_aGA_bMA_cCS_dPb_xSn_{1-x}(I_yBr_{1-y})_3$, $FA_aBzA_bMA_cCs_dPb_xSn_{1-x}(I_yBr_{1-y})_3$, $FA_aEA_bMA_cCS_dPb_xSn_{1-x}(I_yBr_{1-y})_3$, $FA_aDMA_bMA_cCS_dPb_xSn_{1-x}(I_yBr_{1-y})_3$, $FA_aIm_bMA_cCS_dPb_xSn_{1-x}(I_yBr_{1-y})_3$, $FA_aPEA_bMA_cCS_dPb_xSn_{1-x}(I_yBr_{1-y})_3$, $FA_aAc_bMA_cCS_dPb_xSn_{1-x}(I_yBr_{1-y})_3$;

wherein $0<a<1$, $0<b<1$, $0<c<1$, $0<d<1$, $a+b+c+d=1$, $0<x<1$ and $0<y<1$.

In a further embodiment of the invention is provided a semiconductor device having a photoactive layer comprising an organic-inorganic metal halide perovskite material formed according to the first aspect of the invention.

In another embodiment, the semiconductor device is a photovoltaic device with a photoactive region, wherein the photoactive region comprises a thin film of the perovskite material formed according to the first aspect of the invention, with the thickness of the thin film of the perovskite material being in the range from 50 to 2000 nm, preferably 100 nm to 1500 nm. Further, the photoactive region may comprise: an n-type region comprising at least one n-type layer; and a layer of the perovskite material in contact with the n-type region.

The photovoltaic device may comprise an n-type region comprising at least one n-type layer; a p-type region comprising at least one p-type layer; and a layer of the perovskite material disposed between the n-type region and the p-type region.

In another embodiment of the present invention is provided a multijunction photovoltaic device, wherein the device comprises two or more sub-cells, the first sub cell comprising a photovoltaic device as defined above with a bandgap between 1.1 and 2.5 eV, and a further sub-cell comprising a second photoactive with a complementary bandgap.

In one embodiment of the invention, the photovoltaic device may be a single junction device. In another embodiment, the photovoltaic device may be multi-junction device, wherein, according to the device geometry, one or more of the top, middle or bottom sub-cell comprises a perovskite as described herein, in an all-perovskite, perovskite-Si, perovskite-CIGS, perovskite-CuZnSnSSe tandem cells, perovskite-CuZnSnS tandem cells, or perovskite-CdTe heterojunction device.

In another embodiment of the present invention is provided an optoelectronic device comprising the perovskite material formed according to the first aspect of the invention.

In some embodiments, the optoelectronic device may comprise a substrate. The substrate may be a flat planar surface. Alternatively, the substrate may be a textured surface with root mean square roughness ($R_{rms}$) of greater than or equal to 50 nm. The material of the substrate may be selected from glass such as fluorine-doped tin oxide (FTO), Indium tin oxide (ITO), or silicon (Si).

DETAILED DESCRIPTION

Definitions

The term "photoactive", as used herein, refers to a region, layer or material that is capable of responding to light photoelectrically. A photoactive region, layer or material is therefore capable of absorbing the energy carried by photons in light that then results in the generation of electricity (e.g. by generating either electron-hole pairs or excitons).

The term "perovskite", as used herein, refers to a material with a three-dimensional crystal structure related to that of $CaTiO_3$ or a material comprising a layer of material, which layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$ type structure comprises a layer of perovskite material. The skilled person will appreciate that a perovskite material can be represented by the formula $[A][B][X]_3$, wherein [A] is at least one cation, [B] is at least one cation and [X] is at least one anion. When the perovskite comprises more than one A cation, the different A cations may be distributed over the A sites in an ordered or disordered way. When the perovskite comprises more than one B cation, the different B cations may be distributed over the B sites in an ordered or disordered way.

When the perovskite comprises more than one X anion, the different X anions may be distributed over the X sites in an ordered or disordered way. The symmetry of a perovskite comprising more than one A cation, more than one B cation or more than one X cation, will often be lower than that of $CaTiO_3$.

As mentioned in the preceding paragraph, the term "perovskite", as used herein, refers to (a) a material with a three-dimensional crystal structure related to that of $CaTiO_3$ or (b) a material comprising a layer of material, wherein the layer has a structure related to that of $CaTiO_3$. Although both of these categories of perovskite may be used in the devices according to the invention, it is preferable in some circumstances to use a perovskite of the first category, (a), i.e. a perovskite having a three-dimensional (3D) crystal structure. Such perovskites typically comprise a 3D network of perovskite unit cells without any separation between layers. Perovskites of the second category, (b), on the other hand, include perovskites having a two-dimensional (2D) layered structure. Perovskites having a 2D layered structure may comprise layers of perovskite unit cells that are separated by (intercalated) molecules; an example of such a 2D layered perovskite is [2-(1-cyclohexenyl)ethylammonium]2$PbBr_4$. 2D layered perovskites tend to have high exciton binding energies, which favours the generation of bound electron-hole pairs (excitons), rather than free charge carriers, under photoexcitation. The bound electronhole pairs may not be sufficiently mobile to reach the p-type or n-type contact where they can then transfer (ionize) and generate free charge. Consequently, in order to generate free charge, the exciton binding energy has to be overcome, which represents an energetic cost to the charge generation process and results in a lower voltage in a photovoltaic cell and a lower efficiency. In contrast, perovskites having a 3D crystal structure tend to have much lower exciton binding energies (on the order of thermal energy) and can therefore generate free carriers directly following photoexcitation. Accordingly, the perovskite semiconductor employed in the devices and processes of the invention is preferably a perovskite of the first category, (a), i.e. a perovskite which has a three-dimensional crystal structure. This is particularly preferable when the optoelectronic device is a photovoltaic device.

The perovskite material employed in the present invention is one which is capable of absorbing light and thereby generating free charge carriers. Thus, the perovskite employed is a light-absorbing perovskite material. However, the skilled person will appreciate that the perovskite material could also be a perovskite material that is capable of emitting light, by accepting charge, both electrons and holes, which subsequently recombine and emit light. Thus, the perovskite employed may be a light-emitting perovskite.

As the skilled person will appreciate, the perovskite material employed in the present invention may be a perovskite which acts as an n-type, electron-transporting semiconductor when photo-doped. Alternatively, it may be a perovskite which acts as a p-type hole-transporting semiconductor when photo-doped. Thus, the perovskite may be n-type or p-type, or it may be an intrinsic semiconductor. In preferred embodiments, the perovskite employed is one which acts as an n-type, electron-transporting semiconductor when photo-doped. The perovskite material may exhibit ambipolar charge transport, and therefore act as both n-type and p-type semiconductor. In particular, the perovskite may act as both n-type and p-type semiconductor depending upon the type of junction formed between the perovskite and an adjacent material.

Typically, the perovskite semiconductor used in the present invention is a photosensitizing material, i.e. a material which is capable of performing both photogeneration and charge transportation.

The term "mixed-halide", as used herein, refers to a compound comprising at least two different halides. The term "halide" refers to an anion of an element selected from Group 17 of the Periodic Table of the Elements, i.e., of a halogen. Typically, halide anion refers to a fluoride anion, a chloride anion, a bromide anion, an iodide anion or an astatide anion.

The term "metal halide perovskite", as used herein, refers to a perovskite, the formula of which contains at least one metal cation and at least one halide anion. The term "organometal halide perovskite", as used herein, refers to a metal halide perovskite, the formula of which contains at least one organic cation.

The term "organic material" takes its normal meaning in the art. Typically, an organic material refers to a material comprising one or more compounds that comprise a carbon atom. As the skilled person would understand it, an organic compound may comprise a carbon atom covalently bonded to another carbon atom, or to a hydrogen atom, or to a halogen atom, or to a chalcogen atom (for instance an oxygen atom, a sulphur atom, a selenium atom, or a tellurium atom). The skilled person will understand that the term "organic compound" does not typically include compounds that are predominantly ionic such as carbides, for instance.

The term "organic cation" refers to a cation comprising carbon. The cation may comprise further elements, for example, the cation may comprise hydrogen, nitrogen or oxygen. The term "inorganic cation" refers to a cation that is not an organic cation. By default, the term "inorganic cation" refers to a cation that does not contain carbon.

The term "semiconductor", as used herein, refers to a material with electrical conductivity intermediate in magnitude between that of a conductor and a dielectric. A semiconductor may be an n-type semiconductor, a p-type semiconductor or an intrinsic semiconductor.

The term "n-type", as used herein, refers to a region, layer or material that comprises an extrinsic semiconductor with a larger concentration of electrons than holes. In n-type semiconductors, electrons are therefore majority carriers and holes are the minority carriers, and they are therefore electron transporting materials. The term "n-type region", as used herein, therefore refers to a region of one or more electron transporting (i.e. n-type) materials. Similarly, the term "n-type layer" refers to a layer of an electron-transporting (i.e. an n-type) material. An electron-transporting (i.e. an n-type) material could be a single electron-transporting compound or elemental material, or a mixture of two or more electron-transporting compounds or elemental materials. An electron-transporting compound or elemental material may be undoped or doped with one or more dopant elements.

The term "p-type", as used herein, refers to a region, layer or material that comprises an extrinsic semiconductor with a larger concentration of holes than electrons. In p-type semiconductors, holes are the majority carriers and electrons are the minority carriers, and they are therefore hole transporting materials. The term "p-type region", as used herein, therefore refers to a region of one or more hole transporting (i.e. p-type) materials. Similarly, the term "p-type layer" refers to a layer of a hole-transporting (i.e. a p-type) material. A hole-transporting (i.e. a p-type) material could be a single hole-transporting compound or elemental material, or a mixture of two or more hole-transporting compounds or elemental materials. A hole-transporting compound or elemental material may be undoped or doped with one or more dopant elements.

The term "bandgap", as used herein, refers to the energy difference between the top of the valence band and the bottom of the conduction band in a material. The skilled person may readily measure the bandgap of a material without undue experimentation.

The term "layer", as used herein, refers to any structure which is substantially laminar in form (for instance extending substantially in two perpendicular directions, but limited in its extension in the third perpendicular direction). A layer may have a thickness which varies over the extent of the layer. Typically, a layer has approximately constant thickness. The "thickness" of a layer, as used herein, refers to the average thickness of a layer. The thickness of layers may easily be measured, for instance by using microscopy, such as electron microscopy of a cross section of a film, or by surface profilometry for instance using a stylus profilometer.

The term "porous", as used herein, refers to a material within which pores are arranged. Thus, for instance, in a porous material the pores are volumes within the body of the material where there is no material. The individual pores may be the same size or different sizes. The size of the pores is defined as the "pore size". The limiting size of a pore, for most phenomena in which porous solids are involved, is that of its smallest dimension which, in the absence of any further precision, is referred to as the width of the pore (i.e. the width of a slit-shaped pore, the diameter of a cylindrical or spherical pore, etc.). To avoid a misleading change in scale when comparing cylindrical and slit-shaped pores, one should use the diameter of a cylindrical pore (rather than its length) as its "pore-width" (Rouquerol, J. et al, (1994) Recommendations for the characterization of porous solids (Technical Report). Pure and Applied Chemistry, 66(8)). The following distinctions and definitions were adopted in previous IUPAC documents (J. Haber. (1991) Manual on catalyst characterization (Recommendations 1991). Pure and Applied Chemistry): micropores have widths (i.e. pore sizes) smaller than 2 nm; Mesopores have widths (i.e. pore sizes) of from 2 nm to 50 nm; and Macropores have widths (i.e. pore sizes) of greater than 50 nm. In addition, nanopores may be considered to have widths (i.e. pore sizes) of less than 1 nm.

Pores in a material may include "closed" pores as well as open pores. A closed pore is a pore in a material which is a non-connected cavity, i.e. a pore which is isolated within the material and not connected to any other pore and which cannot therefore be accessed by a fluid to which the material is exposed. An "open pore" on the other hand, would be accessible by such a fluid. The concepts of open and closed porosity are discussed in detail in J. Rouquerol et al.

Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity". The term "without open porosity", as used herein, therefore refers to a material with no effective porosity. Thus, a material without open porosity typically has no macropores and no mesopores. A material without open porosity may comprise micropores and nanopores, however. Such micropores and nanopores are typically too small to have a negative effect on a material for which low porosity is desired.

In addition, polycrystalline materials are solids that are composed of a number of separate crystallites or grains, with grain boundaries at the interface between any two crystallites or grains in the material. A polycrystalline material can therefore have both interparticle/interstitial porosity and intraparticle/internal porosity. The terms "interparticle porosity" and "interstitial porosity", as used herein, refer to pores between the crystallites or grains of the polycrystalline material (i.e. the grain boundaries), whilst the terms "intraparticle porosity" and "internal porosity", as used herein, refer to pores within the individual crystallites or grains of the polycrystalline material. In contrast, a single crystal or monocrystalline material is a solid in which the crystal lattice is continuous and unbroken throughout the volume of the material, such that there are no grain boundaries and no interparticle/interstitial porosity.

The term "compact layer", as used herein, refers to a layer without mesoporosity or macroporosity. A compact layer may sometimes have microporosity or nanoporosity.

The term "scaffold material", as used herein, therefore refers to a material that is capable of acting as a support for a further material. The term "porous scaffold material", as used herein, therefore refers to a material which is itself porous, and which is capable of acting as a support for a further material.

The term "transparent", as used herein, refers to material or object allows visible light to pass through almost undisturbed so that objects behind can be distinctly seen. The term "semi-transparent", as used herein, therefore refers to material or object which has a transmission (alternatively and equivalently referred to as a transmittance) to visible light intermediate between a transparent material or object and an opaque material or object. Typically, a transparent material will have an average transmission for visible light (generally light with a wavelength of from 370 to 740 nm) of around 100%, or from 90 to 100%. Typically, an opaque material will have an average transmission for visible light of around 0%, or from 0 to 5%. A semi-transparent material or object will typically have an average transmission for visible light of from 10 to 90%, typically 40 to 60%. Unlike many translucent objects, semi-transparent objects do not typically distort or blur images. Transmission for light may be measured using routine methods, for instance by comparing the intensity of the incident light with the intensity of the transmitted light.

The term "electrode", as used herein, refers to a conductive material or object through which electric current enters or leaves an object, substance, or region. The term "negative electrode", as used herein, refers to an electrode through which electrons leave a material or object (i.e. an electron collecting electrode). A negative electrode is typically referred to as an "anode". The term "positive electrode", as used herein, refers to an electrode through which holes leave a material or object (i.e. a hole collecting electrode). A positive electrode is typically referred to as a "cathode". Within a photovoltaic device, electrons flow from the positive electrode/cathode to the negative electrode/anode, whilst holes flow from the negative electrode/anode to the positive electrode/cathode.

The term "front electrode", as used herein, refers to the electrode provided on that side or surface of a photovoltaic device that it is intended will be exposed to sun light. The front electrode is therefore typically required to be transparent or semi-transparent so as to allow light to pass through the electrode to the photoactive layers provided beneath the front electrode. The term "back electrode", as used herein, therefore refers to the electrode provided on that side or surface of a photovoltaic device that is opposite to the side or surface that it is intended will be exposed to sun light.

The term "charge transporter" refers to a region, layer or material through which a charge carrier (i.e. a particle carrying an electric charge), is free to move. In semiconductors, electrons act as mobile negative charge carriers and holes act as mobile positive charges. The term "electron transporter" therefore refers to a region, layer or material through which electrons can easily flow and that will typically reflect holes (a hole being the absence of an electron that is regarded as a mobile carrier of positive charge in a semiconductor). Conversely, the term "hole transporter" refers to a region, layer or material through which holes can easily flow and that will typically reflect electrons.

The term "volatile compound", as used herein, refers to a compound which is easily removed by evaporation or decomposition. For instance a compound which is easily removed by evaporation or decomposition at a temperature of less than or equal to 150° C., or for instance at a temperature of less than or equal to 100° C., would be a volatile compound. "Volatile compound" also includes compounds which are easily removed by evaporation via decomposition products. Thus, a volatile compound X may evaporate easily thorough evaporation of molecules of X, or a volatile compound X may evaporate easily by decomposing to form two compounds Y and Z which evaporate easily. For instance, ammonium salts can be volatile compounds, and may either evaporate as molecules of the ammonium salt or as decomposition products, for instance ammonium and a hydrogen compound (e.g. a hydrogen halide). Thus, a volatile compound X may have a relatively high vapour pressure (e.g. greater than or equal to 500 Pa) or may have a relatively high decomposition pressure (e.g. greater than or equal to 500 Pa for one or more of the decomposition products), which may also be referred to as a dissociation pressure.

The term "conform", as used herein, refers to an object that is substantially the same in form or shape as an another object. A "conformal layer", as used herein, therefore refers to a layer of material that conforms to the contours of the surface on which the layer is formed. In other words, the morphology of the layer is such that the thickness of the layer is approximately constant across the majority of the interface between the layer and the surface on which the layer is formed.

The term "co-evaporation" as used herein, refers to two or more materials or mixtures of materials heated in separate sources in a high vacuum chamber until they begin to evaporate and subsequently deposit on a substrate simultaneously. This term is interchangeable with the term "co-sublimation".

The term "large organic cation", as used herein, refers to a monovalent organic cation with an ionic radius greater than 2.53 Å, which is able to occupy the A sites of a perovskite structure. The term "additive" as used herein, refers to a component which may be added to perovskite formula to improve the optoelectronic characteristics of a perovskite material and performance characteristics of a corresponding perovskite solar cell device. Thus, the term "large organic cation additive" as used herein, refers to an organic cation of ionic radius greater than 2.53 Å, which is able to occupy the A sites of a perovskite structure and accordingly improve the features of a perovskite material and/or perovskite device.

The term "optoelectronic devices" includes photovoltaic devices, photodiodes (including solar cells), phototransistors, photomultipliers, photoresistors, and light emitting diodes etc.

Photovoltaic Device

The perovskite material of the present invention may be used in a semiconductor device, preferably a photovoltaic device. The perovskite material is advantageously configured to function as a light absorber/photosensitiser within the photoactive region of a photovoltaic device.

The photoactive region may comprise a thin film of the perovskite material, and preferably the thickness of the thin film of the perovskite material is from 50 nm to 2000 nm, preferably 100 nm to 1500, and yet more preferably from 300 to 1200 nm.

The photoactive region may comprise an n-type region comprising at least one n-type layer, and a layer of the perovskite material in contact with the n-type region.

The photoactive region may comprise an n-type region comprising at least one n-type layer, a p-type region comprising at least one p-type layer; and a layer of the perovskite material disposed between the n-type region and the p-type region.

The photoactive region may comprise a layer of the perovskite material without open porosity.

The layer of perovskite material may then form a planar heterojunction with one or both of the n-type region and the p-type region.

Alternatively, although less preferably, the layer of the perovskite material may be in contact with a porous scaffold material that is disposed between the n-type region and the p-type region. The porous scaffold material may comprise or consist essentially of any of a dielectric material and a semiconducting/charge transporting material. The layer of the perovskite material may then be disposed within the pores of/be conformal with a surface of the porous scaffold material. Alternatively, the layer of the perovskite material may fill the pores of the porous scaffold material and form a capping layer on the porous scaffold material, wherein the capping layer consists of a layer of the photoactive material without open porosity.

The photovoltaic device may further comprises a first electrode and a second electrode, with the photoactive region being disposed between the first and second electrodes, wherein the first electrode is in contact with the n-type region of the photoactive region and the second electrode is in contact with the p-type region of the photoactive region. The first and second electrode may then comprise a transparent or light transmissive electrically conductive material and the second electrode may comprise a metal or a second light transmissive electrically conductive material. The first electrode may then be an electron collecting electrode, whilst the second electrode is a hole collecting electrode.

The photovoltaic device may further comprise a first electrode and a second electrode, with the photoactive region being disposed between the first and second electrodes, wherein the first electrode is in contact with the p-type region of the photoactive region and the second electrode is in contact with the n-type region of the photoactive region. The first electrode may then comprise a transparent or light transmissive electrically conductive material, and the second electrode may comprise a metal or a second light transmissive electrically conductive material. The first electrode may then be a hole collecting electrode, whilst the second electrode is an electron collecting electrode.

The photovoltaic device may have a multi-junction structure comprising a first sub-cell disposed over a second sub-cell, the first sub-cell comprising the photoactive region comprising the perovskite material. The photovoltaic device may then have a monolithically integrated structure. In a monolithically integrated multi-junction photovoltaic device the two or more photovoltaic sub-cells are deposited directly onto one another and are therefore electrically connected in series. The photovoltaic device may then further comprise an intermediate region connecting the first sub-cell to the second sub-cell, wherein each intermediate region comprises one or more interconnect layers.

The photovoltaic device having a multi-junction structure may further comprise a first electrode, a second electrode, with the first sub-cell and the second sub-cell disposed between the first and second electrodes.

The first electrode may then be in contact with the p-type region of the first sub-cell, and wherein the first electrode comprises a transparent or semi-transparent electrically conductive material. The first electrode may then be a hole collecting electrode, whilst the second electrode is an electron collecting electrode. In a tandem monolithic device, the second electrode will then be in contact with the second sub-cell, such that the first and second electrodes form the outer components at either end of the device. An intermediate layer is situated between the first and second sub-cells.

Alternatively, the first electrode may be in contact with the n-type region of the first sub-cell, and wherein the first electrode comprises a transparent or semi-transparent electrically conductive material. The first electrode may then be an electron collecting electrode, whilst the second electrode is a hole collecting electrode. In a tandem monolithic device, the second electrode will then be in contact with the second sub-cell, such that the first and second electrodes form the outer components at either end of the device. An intermediate layer is situated between the first and second sub-cells.

When the photovoltaic device has a multi-junction structure the second sub-cell of the photovoltaic device may comprise any of a second perovskite material, crystalline silicon, CdTe, CuZnSnSSe, CuZnSnS, or CuInGaSe (CIGS).

As an alternative, the multijunction solar cell can comprise three sub cells. The present invention covers perovskite layers with a bandgap in the range of 1.1-2.5 eV satisfying each of the sub cell requirements in a multi-junction. For example, the top cell having a perovskite layer according to the present invention having a bandgap in the range 2.0-2.5 eV, the middle sub cell having a perovskite layer according to the present invention having a bandgap 1.5 to 2.0 eV, and the bottom sub cell comprising a sub cell having an energy bandgap in the range 1.1 to 1.4 eV, such as for example, crystalline silicon or a narrow bandgap perovskite layer. The bandgaps for each sub-cell may vary with respect to each other and depending on the geometry of the cell. Generally, a top cell may have a wider bandgap and bottom sub-cell may have a lower bandgap, wherein the middle sub-cell bandgap fits somewhere in between these top and bottom sub-cell values. Any of the top, middle, or bottom sub-cells may have a perovskite layer according to the present invention.

The perovskite layer may be prepared as described in WO2013/171517, WO2014/045021, WO2016/198889, WO2016/005758, WO2017/089819, and in the reference books "Photovoltaic Solar Energy: From Fundamentals to Applications" edited by Angele Reinders and Pierre Verlinden, Wiley-Blackwell (2017) ISBN-13: 978-1118927465 and "Organic-Inorganic Halide Perovskite Photovoltaics: From Fundamentals to Device Architectures" edited by Nam-Gyu Park et al., Springer (2016) ISBN-13: 978-3319351124.

In a preferred device of the present invention, the photoactive layer is a compact layer without open porosity.

The invention will now be illustrated by the following examples.

EXAMPLES

Example 1

Preparation and Analysis of Mixed Halide Precursors

Part of the method to reduce the number of evaporation sources required for co-evaporation of multiple precursors, involved the combination of mixed metal halide precursors, such as $PbI_2$ and $PbBr_2$. The two materials are mixed in a single crucible, melted at a high temperature of >350° C., at ambient pressure and under $N_2$ atmosphere to avoid oxidation. The resulting compound provides a new mixed-halide alloyed phase which can further be sublimed as a single precursor in one evaporation source as part of a co-evaporation process.

To confirm the sublimation of the mixed metal halides as a single entity, compositional and stoichiometric analyses were carried out on consecutive deposition runs of 200 nm mixed lead halide thin films $Pb(I_{1-x}Br_x)_3$ using X-ray photoelectron spectroscopy (XPS). These compounds were then compared to their powder precursor counterparts, as shown by FIG. 1. The maintained stoichiometry of each of the components of the melted mixed lead halides across each run shows the material behaving as a single precursor upon evaporation.

Example 2

Performance Analysis of Standard Triple Cation Double Halide Perovskites

The performance characteristics of a standard triple cation double halide perovskites fabricated using the claimed co-evaporation method was also investigated. Planar p-i-n configuration solar cells were initially fabricated using an ITO electrode coated with a thin hole transport layer (HTL) of poly(triarylamine) (PTAA). The perovskite light-absorber layer, $FAMACsPb(I_{1-x}Br_x)_3$ was then prepared by vacuum co-deposition at $10^{-6}$ mbar of precursors FAI, MAI, CsI and the melted mixed halide phase from Example 1 at deposition rates of 0.6 Å $s^{-1}$, 0.3 Å $s^{-1}$, 0.4 Å $s^{-1}$, and 1.3 Å $s^{-1}$, respectively. Sublimation temperatures for the precursors were approximately 155° C. for FAI, 125° C. for MAI, 310° C. for $Pb(I_{1-x}Br_x)_3$ and 485° C. for CsI. Subsequently, the film was capped with fullerene ETL, $C_{60}$ and a silver top electrode, also via vacuum deposition.

Figure 2A:
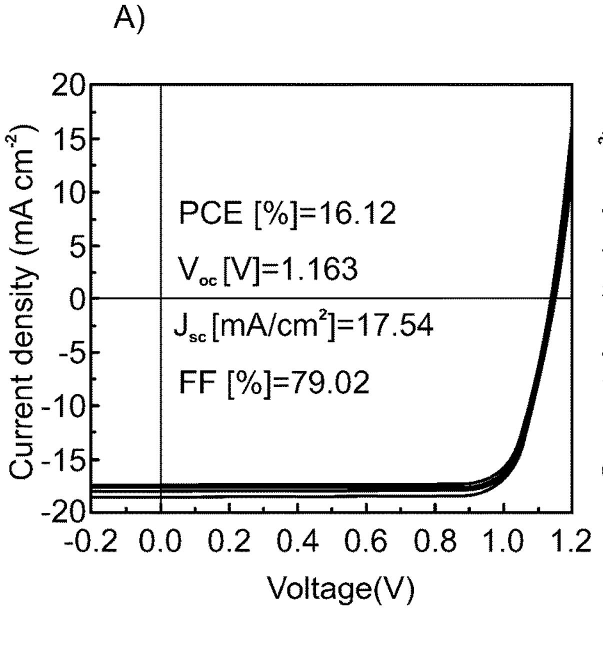
FIG. 2A illustrates the current density vs voltage (J-V) curves under simulated solar illumination for multiple perovskite solar cells using the triple cation perovskite $FAMACsPb(I_{1-x}Br_x)_3$.
Figure 2B:
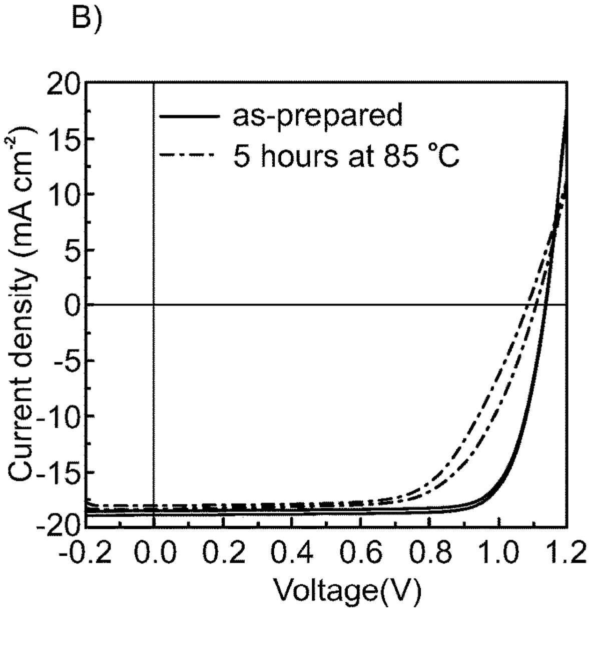
FIG. 2B illustrates the as prepared triple cation perovskite $FAMACsPb(I_{1-x}Br_x)_3$ solar cell after thermal stressing at 85° C. in $N_2$ atmosphere after 5 hours.

Although an appreciable PCE of >16% was obtained for these cells, the thermal stability after stressing on a hotplate at 85° C. in an $N_2$ atmosphere was poor, showing significant degradation in power characteristics, particularly $V_{oc}$ after 5 hours (FIGS. 2A and 2B).

Figures 3A, 3B:
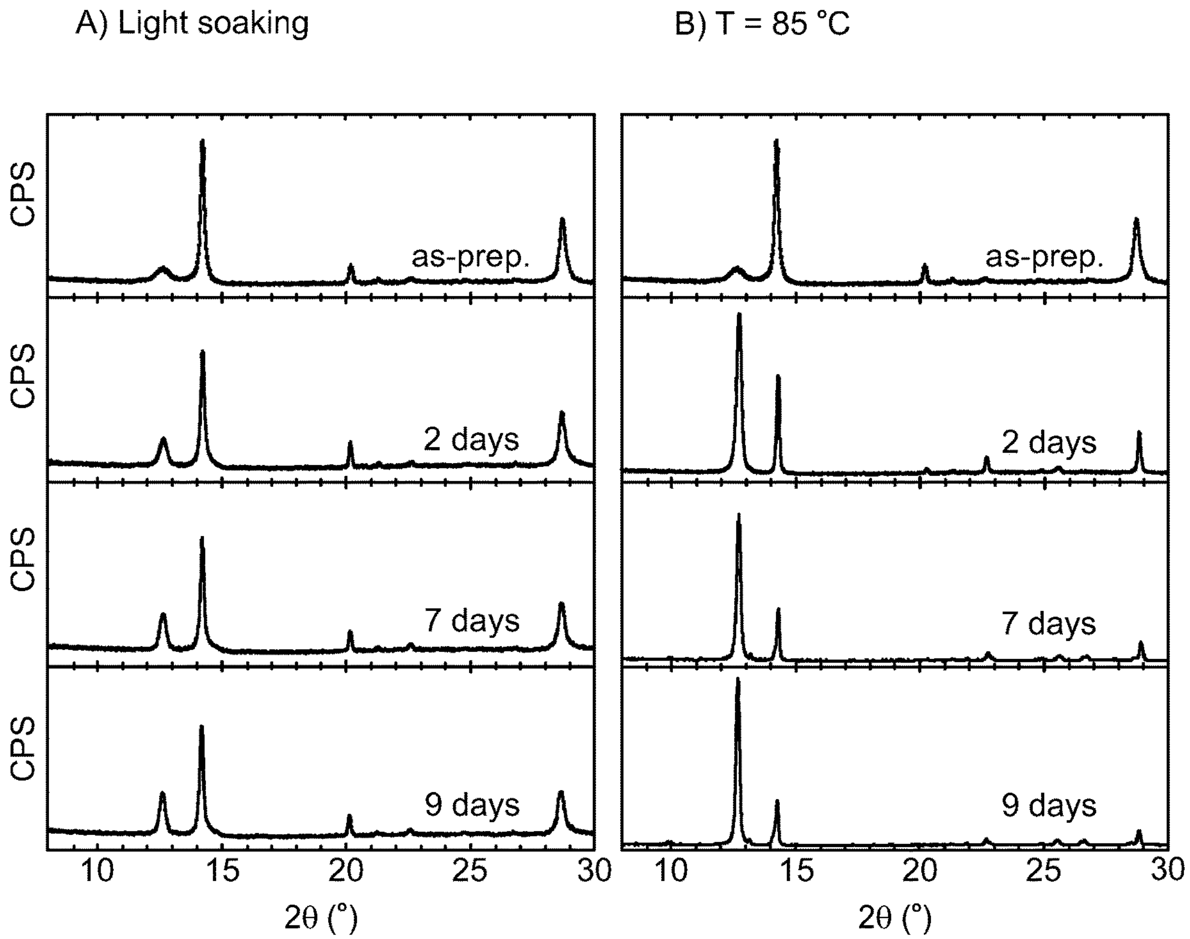
FIG. 3A illustrates stacked XRD patterns taken over a period of "as-prepared", 2 days, 7 days and 9 days of continuous light soaking under constant illumination of 1 sun of the triple cation perovskite $FAMACsPb(I_{1-x}Br_x)_3$.
FIG. 3B illustrates stacked XRD patterns taken over a period of "as-prepared", 2 days, 7 days and 9 days of continuous heat treatment at 85° C. of the triple cation perovskite $FAMACsPb(I_{1-x}Br_x)_3$.

Similarly, FIG. 3B shows the results of periodically ex-situ measured X-ray Diffraction (XRD) of the triple cation perovskite at different time intervals across continual thermal stressing, namely, "as-prepared", 2 days, 7 days and 9 days. By day 9, a striking rise in the degradation $PbI_2$ peak at ~12.7°, accompanied by a decrease in intensity of the main perovskite peak at ~14.3° is observed; a clear indicator of degradation.

In addition, light soaking experiments were also carried out on the samples and periodically analysed by XRD as above. The films were kept under constant illumination of 1 sun equivalent intensity at 35° C. A shown by FIG. 3A, a moderate rise in the $PbI_2$ signal is observed after only 2 days.

These results highlight the insufficient stability of the triple cation vacuum-deposited triple-cation CsMAFA perovskite under thermal stress, which is an important requirement for ensuring longevity of PV devices.

Example 3

Performance Analysis of Large Cation Additive Multicomponent Perovskites

As noted in Example 2, a standard triple cation double halide perovskite fails to exhibit acceptable thermal stability. According to the present invention, a large cation additive, namely GA was inserted into the A sites of the structure to determine the effect on stability.

To form quadruple cation FAGAMACsPb$(I_{1-x}Br_x)_3$, FAI and GAI were mixed in a 10:1 ratio in the same evaporation source and co-evaporated alongside separate sources of CsI, MAI and Pb$(I_{1-x}Br_x)_3$ to form a perovskite film, using the same deposition rates and temperatures for each chamber, as detailed in Example 2.

A triple cation FAGACsPb$(I_{1-x}Br_x)_3$ was also synthesised, similarly by combining FAI and GAI in one source as above, CsI in another, the mixed halide composition in a third, and co-evaporating all three sources.

A reference triple cation formulation without any large cation additive was also synthesised per Example 2, namely FAMACsPb$(I_{1-x}Br_x)_3$, using four separate sources of FAI, MAI, CsI and Pb$(I_{1-x}Br_x)_3$.

Figure 4:
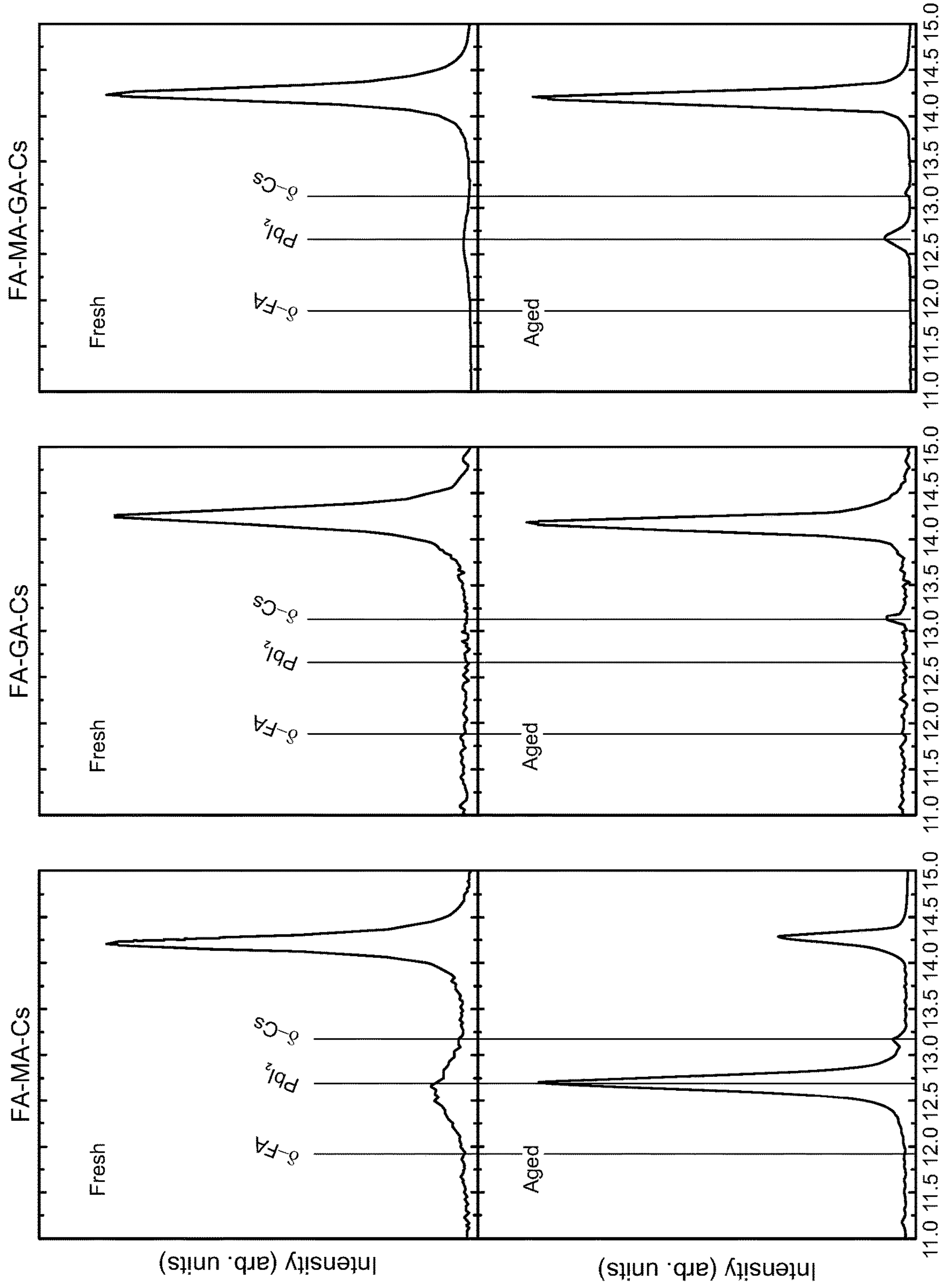
FIG. 4 illustrates the XRD patterns for three perovskite formulations with cations; FAMACs, FAGACs and FAMAGACs, "as-prepared" (fresh) and after one week of thermal stressing at 85° C. in $N_2$ atmosphere (aged).

Subsequently, all of the films were thermally stressed at 85° C. in $N_2$ and monitored over the course of a week. X-ray diffraction (XRD) was used to distinguish any structural evolution, such as the formation of degradation phases ($PbI_2$ peak), as shown by FIG. 4.

The presence of GA in both the triple and quadruple cation significantly enhanced the thermal stability compared to the reference GA-free compound, with no decay peak present in the "as-prepared" films and a remarkably smaller degradation peak after 1 week of thermal treatment. Some minority delta-phases are also present, but they are not necessarily detrimental to the materials as they have been reported to sustain the perovskite stability, as evidenced in Pavlovetc et al., "Suppressing Cation Migration in Triple-Cation Lead Halide Perovskites", ACS Energy Lett. 2020, 5, 2802.

Figure 5A:
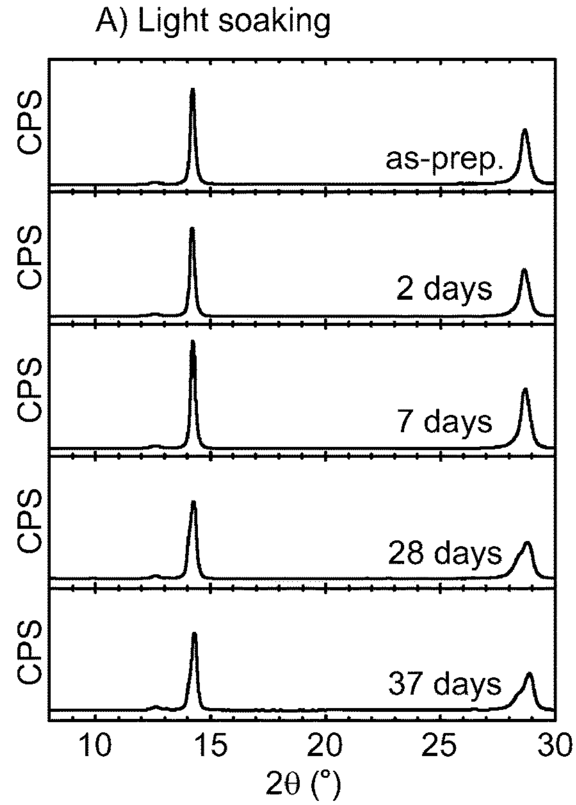
FIG. 5A illustrates stacked XRD patterns taken over a period of "as-prepared", 2 days, 7 days, 28 days and 37 days of continuous light soaking under constant illumination of 1 sun of the quadruple cation perovskite $FAGAMACsPb(I_{1-x}Br_x)_3$.
Figure 5B:
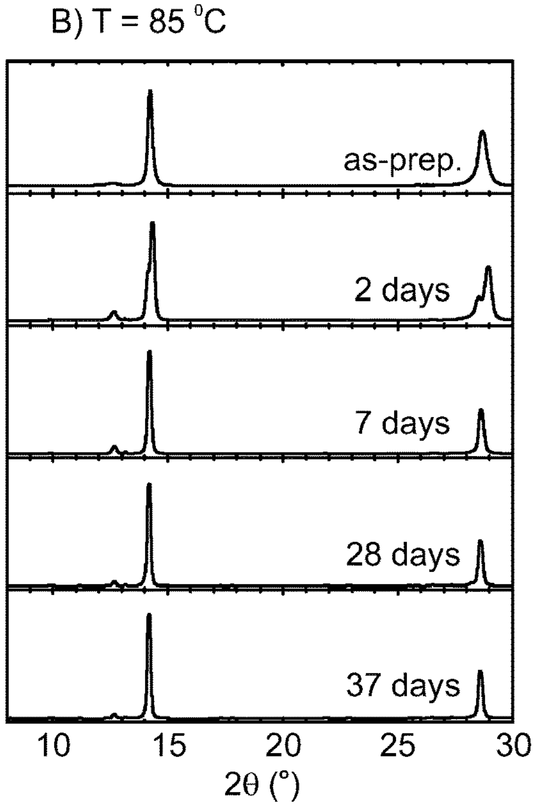
FIG. 5B illustrates stacked XRD patterns taken over a period of "as-prepared", 2 days, 7 days, 28 days and 37 days of continuous heat treatment at 85° C. of the quadruple cation perovskite FAGAMACs $Pb(I_{1-x}Br_x)_3$.

Furthermore, FIG. 5B shows the ex-situ taken XRD patterns for the quadruple cation perovskite analysed at various stages, over a total period of 37 days. Crystallinity of the main peak is sustained at each stage with no distinguishable growth in degradation signals, whereas for the triple cation lacking a "large" additive, degradation is accelerated in even under a week, as found in FIG. 3B.

Parallel to the XRD measurements, light soaking was also carried out on the quadruple cation, whereby structural integrity was upheld and devoid of any significant degradation $PbI_2$ products, as shown by FIG. 5A.

Figure 6:
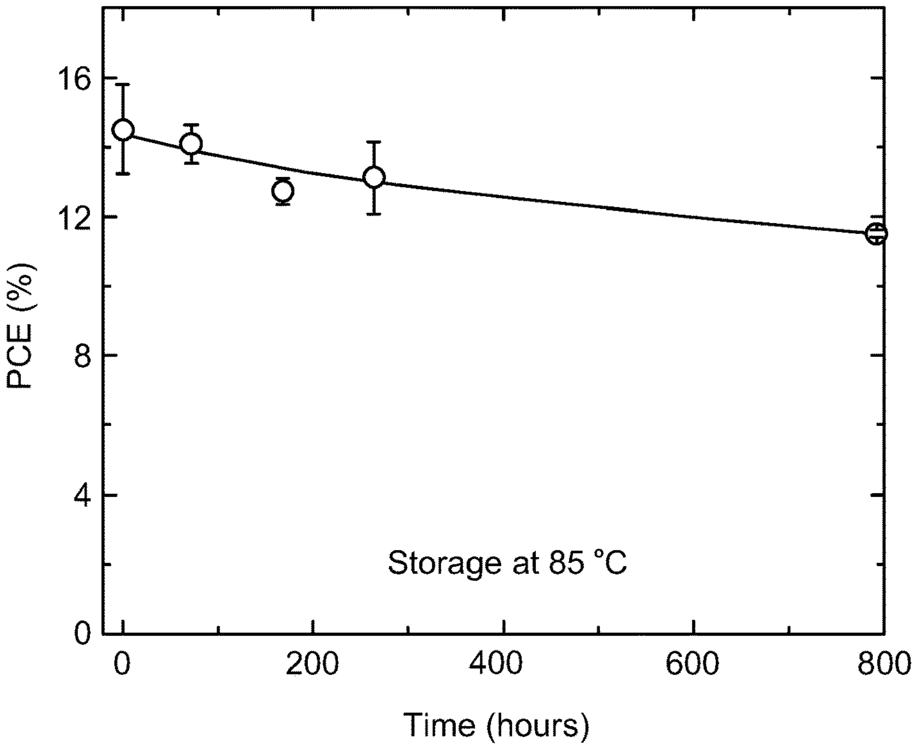
FIG. 6 illustrates the power conversion efficiency (PCE) over time for a GA-based solar cell prepared by vacuum deposition stored in $N_2$ atmosphere at 85° C. in the dark.

To further assess the combined power and stability device characteristics of GA-incorporated multicomponent perovskites, the PCE of the quadruple cation FAGAMACsPb$(I_{1-x}Br_x)_3$ was examined over a month of being stored at a high temperature stress of 85° C. under $N_2$ atmosphere. Across the duration of continual thermal stressing, the cells were found to maintain 80% of their initial efficiency, (FIG. 6), illustrating the superior performance characteristics of vacuum deposited GA-containing films.

The invention includes the following aspects:

1. A method of forming a perovskite material from a plurality of evaporation sources comprising co-subliming from:

(i) a first evaporation source comprising a mixture of co-sublimable organic halides, wherein the organic halides comprise:

a. a first organic halide comprising an organic cation A;

b. a second organic halide comprising an organic cation A' which is different to A and has a larger ionic radius than the first organic cation A; and (ii) a second evaporation source comprising one or more metal halides having the formula (I):

$$B(X_yX'_{1-y})_2 \quad (I)$$

wherein B is a divalent metal cation, X and X' are different halides and 0≤y<1; and (iii) one or more further organic halides from one or more further evaporation sources; and/or (iv) one or more inorganic halides from one or more further evaporation sources;

to form the perovskite material, wherein the perovskite material comprises three or more different cations.

2. A method according to aspect 1 wherein the perovskite material comprises a mixed halide and so wherein 0<y<1.

3. A method according to aspect 1 or 2 wherein the perovskite material comprises three or more different monovalent cations.

4. A method according to any preceding aspect which comprises 3 or 4 evaporation sources.

5. A method according to any preceding aspect, wherein the first and second organic halides comprise the same halide.

6. A method according to any preceding aspect, wherein the second organic halide in step (i) comprises a monovalent cation A'.

7. A method according to any preceding aspect wherein the one or more organic halides in step (iii) and/or the one or more inorganic halides in step (iv) comprise monovalent cations.

8. A method according to any preceding aspect wherein the first organic halide comprises an organic cation A which is a monovalent organic cation, which is preferably FA.

9. A method according to any preceding aspect wherein the second organic halide comprises an organic monocation A' which has an ionic radius greater than the first organic cation A and is preferably selected from guanidinium (GA), dimethylammonium (DMA), benzylammonium (BzA), Ethylammonium (EA), Imidazolium (Im), Acetamidinium (Ac) and Phenylethylammonium (PEA), preferably wherein A' is GA.

10. A method according to any preceding aspect which comprises a preceding step before step (i) of preparing the first evaporation source, which step comprises mixing two cationic halide salts by a mechanical mixing method.

11. A method according to any preceding aspect, wherein step (ii) comprises a preceding step of forming a compound of formula (I) $B(X_yX'_{1-y})_2$, which step comprises mixing of one or more metal halides, $BX_2$ and/or $BX'_2$ and heating in an inert atmosphere.

12. A method according to aspect 11 wherein $B(X_yX'_{1-y})_2$ is $PbI_yBr_{1-y}$, which step comprises mixing $PbBr_2$ and $PbI_2$ and heating in an inert atmosphere.

13. A method according to aspect 11 wherein the one or more metal halides $BX_2$ and $BX'_2$ comprise two different B cations and two different halides anions, such that formula (I) is $B_xB'_{1-x}(X_yX'_{1-y})_2$, wherein 0<x<1 and 0<y<1 and B is a divalent metal cation different from B', preferably wherein B and B' are selected from Pb and Sn.

14. A method according to aspect 11 wherein in step (ii) the second evaporation source comprises two mixed-metal halides selected from:

a) $PbI_2$ and $SnI_2$ to give a single precursor phase $Pb_xSn_{1-x}I_2$;

b) $PbBr_2$ and $SnBr_2$ to give a single precursor phase $Pb_xSn_{1-x}Br_2$;

c) $PbI_2$ and $SnBr_2$ to give a single precursor phase $Pb_xSn_{1-x}(I_{1-y}Br_y)_2$; and d) $PbBr_2$ and $SnI_2$ to give a single precursor phase $Pb_xSn_{1-x}(I_{1-y}Br_y)_2$;

wherein 0<x<1 and 0<y<1.

15. A method according to any preceding aspect which comprises a step (iv) in which an inorganic halide is provided, preferably wherein the inorganic halide is CsI or CsBr.

16. A method according to aspect 15 which comprises 4 evaporation sources and wherein in step (ii) y>0, such that two different metal halides are mixed, and in step (iii) an organic halide is provided in a third evaporation source and in step (iv) an inorganic halide is provided in a fourth evaporation source.

17. A method according to aspect 16 wherein the two metal halides which are mixed are $PbI_2$ and $PbBr_2$ to give the single precursor phase $Pb(I_yBr_{1-y})_2$ in step (ii), wherein 0<y<1.

18. A method according to aspects 1 and 3 to 11 when not dependent on aspect 2, which comprises 4 evaporation sources and wherein in step (ii), y=0, such that only one halide component is provided in the perovskite material, and in step (iii) an organic halide is provided in a third evaporation source and wherein an inorganic halide is provided in step (iv), preferably wherein the inorganic halide is CsI or CsBr.

19. A method according to aspects 1 to and 3 to 11 when not dependent on aspect 2, which comprises 4 evaporation sources and wherein in step (ii), y=0, such that only one halide component is provided in step (ii), and in step (iii) an organic halide is provided in a third evaporation source and wherein a preceding step of preparing (iv) comprises the heating of the two inorganic halides, preferably CsI and CsBr, together in an inert atmosphere in a single evaporation source to give a precursor of mixed halide phases according to the formula (II) $Cs(I_ZBr_{1\_})$, wherein 0<z<1.

20. A method according to any preceding aspect, wherein in step (iii) CsI is provided in a third evaporation source and MAI is provided in a fourth evaporation source.

21. A method according to any preceding aspect for forming a thin film of perovskite material.

22. A method according to any preceding aspect wherein the perovskite material has a bandgap of 1.1 to 2.5 eV.

23. A method according to any preceding aspect wherein the perovskite material has formula (II):

$$A_aA'_bA''_cA'''_dB_xB'_{1-x}(X_yX'_{1-y})_3, \quad \text{(II)}$$

wherein;

A is a first monovalent organic cation which is co-sublimable with A', when both A and A' are present as halides';

A' is a second monovalent organic cation with a larger ionic radius than A;

A" and A'" are independently selected from a monovalent inorganic cation or a further monovalent organic cation;

wherein all A cations are different from each other and at least three of them are present;

$$0 < a < 1$$
$$0 < b < 1$$
$$0 < c < 1$$
$$0 \le d < 1$$
$$a + b + c + d = 1$$
$$0 \le x < 1; \text{ and } 0 \le y < 1;$$

B and B' are independently selected from divalent metal cations;

and X and X' are independently selected from halide anions.

24. A method according to aspect 23 wherein A" and A'" are different to each other and selected from any of:

(iii) A group of organic cations comprising MA or FA, preferably MA and/or;

(iv) A Cs or Rb cation, preferably Cs.

25. A method according to aspect 23 or 24 wherein X and X' are different to each other and selected from: Cl, Br and I, preferably wherein the halides X and X' are I and Br.

26. A method according to any one of aspects 23-25, wherein B is $Pb^{2+}$ or $Sn^{2+}$, optionally wherein B' is different from B and also selected from $Pb^{2+}$ or $Sn^{2+}$.

27. A perovskite material obtainable by a method according to any preceding aspect.

28. A perovskite material which comprises a quadruple cation double halide and optionally mixed metal, selected from:

$FA_aGA_bMA_cCS_dPb(I_yBr_{1-y})_3$, $FA_aEA_bMA_cCS_dPb(I_yBr_{1-y})_3$, $FA_aBzA_bMA_cCS_dPb(I_yBr_{1-y})_3$, $FA_aDMA_bMA_cCS_dPb(I_yBr_{1-y})_3$, $FA_aGA_bMA_cCS_dSn(I_yBr_{1-y})_3$, $FA_aEA_bMA_cCs_cSn(I_yBr_{1-y})_3$, $FA_aBzA_bMA_cCS_dSn(I_yBr_{1-y})_3$, $FA_aDMA_bMA_cCs_dSn(I_yBr_{1-y})_3$, $FA_aIm_bMA_cCs_dPb(I_yBr_{1-y})_3$, $FA_aIm_bMA_cCs_dSn(I_yBr_{1-y})_3$, $FA_aPEA_bMA_cCS_dSn(I_yBr_{1-y})_3$, $FA_aAc_bMA_cCS_dPb(I_yBr_{1-y})_3$, $FA_aAc_bMA_cCS_dSn(I_yBr_{1-y})_3$, $FA_aGA_bMA_cCS_dPb_xSn_{1-x}(I_yBr_{1-y})_3$, $FA_aBzA_bMA_cCS_dPb_xSn_{1-x}(I_yBr_{1-y})_3$, $FA_aEA_bMA_cCS_dPb_xSn_{1-x}(I_yBr_{1-y})_3$, $FA_aDMA_bMA_cCs_dPb_xSn_{1-x}(I_yBr_{1-y})_3$, $FA_aIm_bMA_cCs_dPb_xSn_{1-x}(I_yBr_{1-y})_3$, $FA_aPEA_bMA_cCS_dPb_xSn_{1-x}(I_yBr_{1-y})_3$, $FA_aAc_bMA_cCS_dPb_xSn_{1-x}(I_yBr_{1-y})_3$;

wherein 0<a<1, 0<b<1, 0<c<1, 0<d<1, a+b+c+d=1, 0<x<1 and 0<y<1.

29. A perovskite material which comprises a triple cation double halide and optionally mixed metal, selected from:

$MA_aGA_bCs_cPb(I_yBr_{1-y})_3$, $FA_aBzA_bMA_cPb(I_yBr_{1-y})_3$, $FA_aBzA_bCs_cPb(I_yBr_{1-y})_3$, $MA_aBzA_bCs_cPb(I_yBr_{1-y})_3$, $MA_aDMA_bCs_cPb(I_yBr_{1-y})$, $FA_aGA_bMA_cSn(I_yBr_{1-y})_3$, $FA_aGA_bCs_cSn(I_yBr_{1-y})_3$, $MA_aGA_bCs_cSn(I_yBr_{1-y})_3$, $FA_aBzA_bMA_cSn(I_yBr_{1-y})_3$, $FA_aBzA_bCs_cSn(I_yBr_{1-y})_3$, $MA_aBzA_bCs_cSn(I_yBr_{1-y})_3$, $FA_aDMA_bCs_cSn(I_yBr_{1-y})_3$, $FA_aDMA_bMA_cSn(I_yBr_{1-y})_3$, $MA_aDMA_bCs_cSn(I_yBr_{1-y})$, $FA_aIm_bCs_cSn(I_yBr_{1-y})_3$, $FA_aPEA_bCs_cPb(I_yBr_{1-y})_3$, $FA_aPEA_bCs_cSn(I_yBr_{1-y})_3$, $FA_aAc_bCs_cSn$ $(I_yBr_{1-y})_3$, $FA_aBzA_bMA_cPb(I_yBr_{1-y})_3$, $FA_aBzA_bMA_cSn(I_yBr_{1-y})_3$, $FA_aIm_bMA_cPb(I_yBr_{1-y})_3$, $FA_aIm_bMA_cSn(I_yBr_{1-y})_3$, $FA_aPEA_bMA_cPb(I_yBr_{1-y})_3$, $FA_aPEA_bMA_cSn(I_yBr_{1-y})_3$, $FA_aEA_bCs_cSn(I_yBr_{1-y})_3$, $FA_aEA_bMA_cSn(I_yBr_{1-y})_3$, $MA_aEA_bCs_cPb(I_yBr_{1-y})_3$, $MA_aEA_bCs_cSn(I_yBr_{1-y})_3$, $FA_aGA_bMA_cPb_xSn_{1-x}(I_yBr_{1-y})_3$, $FA_aGA_bCs_cPb_xSn_{1-x}(I_yBr_{1-y})_3$, $MA_aGA_bCs_cPb_xSn_{1-x}(I_yBr_{1-y})_3$, $FA_aBzA_bMA_cPb_xSn_{1-x}(I_yBr_{1-y})_3$, $FA_aBzA_bCs_cPb_xSn_{1-x}(I_yBr_{1-y})_3$, $MA_aBzA_bCs_cPb_xSn_{1-x}(I_yBr_{1-y})_3$, $FA_aDMA_bCs_cPb_xSn_{1-x}(I_yBr_{1-y})_3$, $FA_aDMA_bMA_cPb_xSn_{1-x}(I_yBr_{1-y})_3$, $MA_aDMA_bCs_cPb_xSn_{1-x}(I_yBr_{1-y})$, $FA_aIm_bMA_cPb_xSn_{1-x}(I_yBr_{1-y})_3$, $FA_aIm_bCs_cPb_xSn_{1-x}(I_yBr_{1-y})_3$, $FA_aPEA_bMA_cPb_xSn_{1-x}(I_yBr_{1-y})_3$, $FA_aPEA_bCs_cPb_xSn_{1-x}(I_yBr_{1-y})_3$, $FA_aAc_bMA_cPb_xSn_{1-x}(I_yBr_{1-y})_3$, $FA_aAc_bCs_cPb_xSn_{1-x}(I_yBr_{1-y})_3$;

wherein 0<a<1, 0<b<1, 0<c<1, 0<d<1, a+b+c+d=1, 0<x<1 and 0<y<1.

30. A semiconductor device having a photoactive region comprising a perovskite material as claimed in any of aspects 27 to 29.

31. A semiconductor device according to aspect 30, wherein the semiconductor device is an optoelectronic device, preferably a photovoltaic device having a photoactive region.

32. A photovoltaic device comprising a photovoltaic material prepared according to the method of any one of aspects 1 to 26, wherein the photovoltaic device comprises a photoactive region which comprises a thin film of the perovskite material, the thickness of the thin film of the perovskite material being in the range from 50 nm to 2000 nm.

33. A photovoltaic device according to aspect 32, wherein the photoactive region comprises: an n-type region comprising at least one n-type layer; and a layer of the perovskite material in contact with the n-type region.

34. A photovoltaic device according to aspect 32 or 33, wherein the photoactive region comprises: an n-type region comprising at least one n-type layer;

a p-type region comprising at least one p-type layer; and a layer of the perovskite material disposed between the n-type region and the p-type region.

35. A multijunction photovoltaic device comprising two or more sub-cells, the first sub cell comprising a photovoltaic device as claimed in any one of aspects 32 to 34, and a further sub-cell comprising a photoactive layer, which may optionally comprise a perovskite layer prepared according to any one of aspects 1 to 26.

The invention claimed is:

1. A method of forming a perovskite material from a plurality of evaporation sources comprising co-subliming from:

(i) a first evaporation source comprising a mixture of co-sublimable organic halides, wherein the organic halides comprise:

a. a first organic halide comprising a first monovalent organic cation A;

b. a second organic halide comprising a second monovalent organic cation A' which is different from the first monovalent organic cation A and has a larger ionic radius than the first monovalent organic cation A; and (ii) a second evaporation source comprising one or more metal halides having the formula (I):

$$B_xB'_{1-x}(X_yX'_{1-y})_2 \quad \text{(I)}$$

wherein B and B' are each independently a divalent metal cation and wherein 0≤x≤1, X and X' are different halides and 0≤y<1; and (iii) one or more further organic halides from one or more further evaporation sources; and/or (iv) one or more inorganic halides from one or more further evaporation sources; to form the perovskite material, wherein the perovskite material has formula (II):

$$A_aA'_bA''_cA'''_dB_xB'_{1-x}(X_yX'_{1-y})_3, \quad \text{(II)}$$

wherein;

A is co-sublimable with A', when both A and A' are present as halides;

A" and A'" are independently selected from a monovalent inorganic cation or a further monovalent organic cation;

wherein A, A', A" and A'" are different from each other and at least three of them are present;

$$0 < a < 1$$
$$0 < b < 1$$
$$0 < c < 1$$
$$0 \le d < 1$$
$$a + b + c + d = 1$$
$$0 \le x < 1; \text{ and}$$
$$0 \le y < 1$$

and X and X' are independently selected from halide anion.

2. The method according to claim 1 wherein precursors in the first and second evaporation sources are congruently or non-congruently sublimed, wherein the difference in sublimation temperatures of the precursors for congruent sublimation is up to 20° C. and the difference in sublimation temperatures of the precursors for non-congruent sublimation is between 50 to 150° C.

3. The method according to claim 1 wherein the halides in the organic and/or inorganic halides are selected from iodine and bromine.

4. The method according to claim 1 wherein the one or more further organic halides in step (iii) are different from the first organic halide.

5. The method according to claim 1, wherein the perovskite material comprises a mixed halide (0<y<1).

6. The method according to claim 1, wherein the method comprises co-subliming from the first and second evaporation sources together with one further evaporation source; or wherein the method comprises co-subliming from the first and second evaporation sources together with two further evaporation sources, wherein each further evaporation source comprises one or more further organic halides or one or more inorganic halides.

7. The method according to claim 1, wherein the first organic halide comprises an organic cation A which is a monovalent organic cation.

8. The method according to claim 1, wherein A' is selected from guanidinium (GA), dimethylammonium (DMA), benzylammonium (BzA), Ethylammonium (EA), Imidazolium (Im), Acetamidinium (Ac) and Phenylethylammonium (PEA).

9. The method according to claim 1, wherein the compound of formula (I) $B_xB'_{1-x}(X_yX'_{1-y})_2$ has been formed by introducing one or more metal halides, $BX_2$ and/or $B'X'_2$ into the second evaporation source and heating in an inert atmosphere.

10. The method according to claim 9 wherein $0<x<1$ and $0<y<1$.

11. The method according to claim 1, wherein in step (iv) an inorganic halide is provided wherein the inorganic halide is Cs-based.

12. The method according to claim 11 wherein the method comprises co-subliming from the first and second evaporation sources together with two further evaporation sources, wherein the two further evaporation sources comprise a further organic halide and an inorganic halide respectively and wherein $y>0$.

13. The method according to claim 12 wherein the one or more metal halides are $PbI_2$ and $PbBr_2$ to give the single precursor phase $Pb(I_yBr_{1-y})_2$ in step (ii), wherein $0<y<1$ and x is 1.

14. The method according to claim 1, wherein the method comprises co-subliming from the first and second evaporation sources together with two further evaporation sources, wherein the two further evaporation sources comprise a further organic halide and an inorganic halide respectively and wherein $y=0$.

15. The method according to claim 1, wherein the method comprises co-subliming from the first and second evaporation sources together with two further evaporation sources, wherein the two further evaporation sources comprise a further organic halide and an inorganic halide respectively, said inorganic halide having formula $Cs(I_zBr_{1-z})$, wherein $0<z<1$ and having been formed by introducing CsI and CsBr together and heating in an inert atmosphere.

16. The method according to claim 1, for forming a thin film of perovskite material.

17. The method according to claim 1, wherein B or B' comprises $Pb^{2+}$ or $Sn^{2+}$.

18. A method of making a multi-junction photovoltaic device comprising two or more sub-cells, the first sub-cell comprising a photovoltaic device, wherein the photovoltaic device comprises a photoactive region comprising a perovskite material prepared according to the method of claim 1; and a further sub-cell comprising a photovoltaic device, wherein the photovoltaic device comprises a photoactive region.

19. A perovskite material obtainable by a method according to claim 1.

20. The perovskite material according to claim 19 wherein B or B' comprises Pb or Sn, wherein the one or more further organic halides in step (iii) are different from the first organic halide, and wherein the one or more inorganic halides comprise Cs as the inorganic portion.

21. A perovskite material which comprises a quadruple cation double halide, selected from:

$FA_aEA_bMA_cCs_dPb(I_yBr_{1-y})_3$, $FA_aBzA_bMA_cCs_dPb(I_yBr_{1-y})_3$, $FA_aDMA_bMA_cCs_dPb(I_yBr_{1-y})_3$, $FA_aGA_bMA_cCs_dSn(I_yBr_{1-y})_3$, $FA_aEA_bMA_cCs_dSn(I_yBr_{1-y})_3$, $FA_aBzA_bMA_cCs_dSn(I_yBr_{1-y})_3$, $FA_aDMA_bMA_cCs_dSn(I_yBr_{1-y})_3$, $FA_aIm_bMA_cCs_dPb(I_yBr_{1-y})_3$, $FA_aIm_bMA_cCs_dSn(I_yBr_{1-y})_3$, $FA_aPEA_bMA_cCs_dSn(I_yBr_{1-y})_3$, $FA_aAC_bMA_cCs_dPb(I_yBr_{1-y})_3$, $FA_aAC_bMA_cCS_dSn(I_yBr_{1-y})_3$, $FA_aGA_bMA_cCs_dPb_xSn_{1-x}(I_yBr_{1-y})_3$, $FA_aBzA_bMA_cCs_dPb_xSn_{1-x}(I_yBr_{1-y})_3$, $FA_aEA_bMA_cCs_dPb_xSn_{1-x}(I_yBr_{1-y})_3$, $FA_aDMA_bMA_cCs_dPb_xSn_{1-x}(I_yBr_{1-y})_3$, $FA_aIm_bMA_cCs_dPb_xSn_{1-x}(I_yBr_{1-y})_3$, $FA_aPEA_bMA_cCs_dPb_xSn_{1-x}(I_yBr_{1-y})_3$, $FA_aAC_bMA_cCs_dPb_xSn_{1-x}(I_yBr_{1-y})_3$;

wherein $0<a<1$, $0<b<1$, $0<c<1$, $0<d<1$, $a+b+c+d=1$, $0<x<1$ and $0<y<1$;

or a perovskite material which comprises a triple cation double halide, selected from:

$MA_aGA_bCs_cPb(I_yBr_{1-y})_3$, $FA_aBzA_bMA_cPb(I_yBr_{1-y})_3$, $FA_aBzA_bCs_cPb(I_yBr_{1-y})_3$, $MA_aBzA_bCs_cPb(I_yBr_{1-y})_3$, $MA_aDMA_bCs_cPb(I_yBr_{1-y})$, $FA_aGA_bMA_cSn(I_yBr_{1-y})_3$, $FA_aGA_bCs_cSn(I_yBr_{1-y})_3$, $MA_aGA_bCs_cSn(I_yBr_{1-y})_3$, $FA_aBzA_bMA_cSn(I_yBr_{1-y})_3$, $FA_aBzA_bCs_cSn(I_yBr_{1-y})_3$, $MA_aBzA_bCs_cSn(I_yBr_{1-y})_3$, $FA_aDMA_bCs_cSn(I_yBr_{1-y})_3$, $FA_aDMA_bMA_cSn(I_yBr_{1-y})_3$, $MA_aDMA_bCs_cSn(I_yBr_{1-y})$, $FA_aIm_bCs_cSn(I_yBr_{1-y})_3$, $FA_aPEA_bCs_cPb(I_yBr_{1-y})_3$, $FA_aPEA_bCs_cSn(I_yBr_{1-y})_3$, $FA_aAC_bCs_cSn(I_yBr_{1-y})_3$, $FA_aBzA_bMA_cPb(I_yBr_{1-y})_3$, $FA_aBzA_bMA_cSn(I_yBr_{1-y})_3$, $FA_aIm_bMA_cPb(I_yBr_{1-y})_3$, $FA_aIm_bMA_cSn(I_yBr_{1-y})_3$, $FA_aPEA_bMA_cPb(I_yBr_{1-y})_3$, $FA_aPEA_bMA_cSn(I_yBr_{1-y})_3$, $FA_aEA_bCs_cSn(I_yBr_{1-y})_3$, $FA_aEA_bMA_cSn(I_yBr_{1-y})_3$, $MA_aEA_bCs_cPb(I_yBr_{1-y})_3$, $MA_aEA_bCs_cSn(I_yBr_{1-y})_3$, $FA_aGA_bMA_cPb_xSn_{1-x}(I_yBr_{1-y})_3$, $FA_aGA_bCs_cPb_xSn_{1-x}(I_yBr_{1-y})_3$, $MA_aGA_bCs_cPb_xSn_{1-x}(I_yBr_{1-y})_3$, $FA_aBzA_bMA_cPb_xSn_{1-x}(I_yBr_{1-y})_3$, $FA_aBzA_bCs_cPb_xSn_{1-x}(I_yBr_{1-y})_3$, $MA_aBzA_bCs_cPb_xSn_{1-x}(I_yBr_{1-y})_3$, $FA_aDMA_bCs_cPb_xSn_{1-x}(I_yBr_{1-y})_3$, $FA_aDMA_bMA_cPb_xSn_{1-x}(I_yBr_{1-y})_3$, $MA_aDMA_bCs_cPb_xSn_{1-x}(I_yBr_{1-y})$, $FA_aIm_bMA_cPb_xSn_{1-x}(I_yBr_{1-y})_3$, $FA_aIm_bCs_cPb_xSn_{1-x}(I_yBr_{1-y})_3$, $FA_aPEA_bMA_cPb_xSn_{1-x}(I_yBr_{1-y})_3$, $FA_aPEA_bCs_cPb_xSn_{1-x}(I_yBr_{1-y})_3$, $FA_aAC_bMA_cPb_xSn_{1-x}(I_yBr_{1-y})_3$, $FA_aAC_bCs_cPb_xSn_{1-x}(I_yBr_{1-y})_3$;

wherein $0<a<1$, $0<b<1$, $0<c<1$, $0<d<1$, $a+b+c+d=1$, $0<x<1$ and $0<y<1$, wherein FA denotes formamidinium, MA denotes methylammonium, GA denotes guanidinium, PEA denotes phenyl ethylammonium, BzA denotes benzylammonium, Im denotes imidazolium, DMA denotes dimethyl ammonium, EA denotes ethylammomium and Ac denotes acetamidinium.

22. A semiconductor device having a photoactive region comprising a perovskite material as claimed in claim 19.

23. The method according to claim 7, wherein the first organic halide comprises an organic cation A which is methylammonium (MA) or formamidinium (FA).

24. The method according to claim 8, wherein the second organic halide comprises an organic monocation A' which is guanidinium (GA).

25. The method according to claim 11, wherein the inorganic halide is CsI or CsBr.

26. A semiconductor device having a photoactive region comprising a perovskite material as claimed in claim 21.

* * * * *